(12) United States Patent
Maeda et al.

(10) Patent No.: US 10,573,834 B2
(45) Date of Patent: Feb. 25, 2020

(54) COATING LIQUID FOR GATE INSULATING FILM, GATE INSULATING FILM AND ORGANIC TRANSISTOR

(71) Applicant: Nissan Chemical Industries, Ltd., Chiyoda-ku (JP)

(72) Inventors: Shinichi Maeda, Funabashi (JP); Yosuke Iinuma, Funabashi (JP)

(73) Assignee: Nissan Chemical Industries, Ltd., Chiyoda-ku (JP)

(*) Notice: Subject to any disclaimer, the term of this patent is extended or adjusted under 35 U.S.C. 154(b) by 519 days.

(21) Appl. No.: 14/226,225

(22) Filed: Mar. 26, 2014

(65) Prior Publication Data

US 2014/0206135 A1    Jul. 24, 2014

Related U.S. Application Data

(62) Division of application No. 12/302,031, filed as application No. PCT/JP2007/060552 on May 23, 2007, now abandoned.

(30) Foreign Application Priority Data

May 24, 2006  (JP) .................. 2006-143716

(51) Int. Cl.
  *H01L 51/05*  (2006.01)
  *H01L 51/00*  (2006.01)
(52) U.S. Cl.
  CPC ........ *H01L 51/052* (2013.01); *H01L 51/0001* (2013.01); *H01L 51/0003* (2013.01); *H01L 51/0036* (2013.01); *H01L 51/0541* (2013.01); *H01L 51/0545* (2013.01)
(58) Field of Classification Search
  CPC ... H01L 51/052; C08G 73/1042; C08G 73/10; C08G 73/1075; C08G 73/1078; C09D 179/08
  See application file for complete search history.

(56) References Cited

U.S. PATENT DOCUMENTS

| | | | |
|---|---|---|---|
| 4,824,731 A | 4/1989 | Matsuyama et al. | |
| 4,978,737 A * | 12/1990 | Vora ................. | C08G 73/1042 528/176 |
| 6,294,639 B1 * | 9/2001 | Sawahata et al. ............ 528/170 |
| 6,489,431 B1 | 12/2002 | Ishii et al. | |
| 2003/0218166 A1 | 11/2003 | Tsutsui | |
| 2004/0031950 A1 * | 2/2004 | Shimizu et al. ........... 252/299.4 |
| 2004/0197699 A1 | 10/2004 | Nakayama et al. | |
| 2005/0156161 A1 * | 7/2005 | Hanna et al. .................. 257/40 |

FOREIGN PATENT DOCUMENTS

| | | |
|---|---|---|
| EP | 1 146 063 A1 | 10/2001 |
| EP | 1 450 203 A1 | 8/2004 |
| JP | 64 24231 | 1/1989 |
| JP | 2003-258260 | 9/2003 |
| JP | 2004-72049 | 3/2004 |
| JP | 2005 135970 | 5/2005 |
| JP | 2006-124650 | 5/2006 |
| WO | WO 99/33923 A1 | 7/1999 |
| WO | WO 00/22029 | 4/2000 |
| WO | WO 03/03/22955 * | 3/2003 |
| WO | 2003 029899 | 4/2003 |
| WO | WO 2005/113645 A1 | 12/2005 |

OTHER PUBLICATIONS

Marcus Halik, et al., "High-mobility organic thin-film transistors based on α, α'-didecyloligothiophenes", Journal of Applied Physics, vol. 93, No. 5, Mar. 1, 2003, pp. 2977-2981.

Yasaku Kato, et al., "High mobility of pentacene field-effect transistors with polymide gate dielectric layers", Applied Physics Letters, vol. 84, No. 19, May 10, 2004, pp. 3789-3791.

Extended European Search Report dated Aug. 31, 2011, in European Patent Application No. 07743986.7.

Extended Search Report dated Nov. 21, 2012 in European Patent Application No. 07 743 986.7.

* cited by examiner

*Primary Examiner* — Gregory Listvoyb
(74) *Attorney, Agent, or Firm* — Oblon, McClelland, Maier & Neustadt, L.L.P.

(57) ABSTRACT

To provide a coating fluid for a gate insulating film, which can be baked at a low temperature of at most 180C; a gate insulating film having excellent solvent resistance and further having good characteristics in e.g. specific resistance or semiconductor mobility; and an organic transistor employing the gate insulating film. A coating fluid for a gate insulating film, which comprises a polyimide obtainable by cyclodehydration of a polyamic acid having repeating units of a specific structure, a gate insulating film employing the coating fluid, and the organic transistor employing the gate insulating film.

21 Claims, 3 Drawing Sheets

COATING LIQUID FOR GATE INSULATING FILM, GATE INSULATING FILM AND ORGANIC TRANSISTOR

The present application is a Divisional application of Ser. No 12/302,031, having a filing date of Nov. 24, 2008, pending, which is a national stage application of PCT/JP07/60552 having a filing date of May 23, 2007 and claims priority to Japanese Patent Application No. 2006-143716 having a filing date of May 24, 2006.

TECHNICAL FIELD

The present invention relates to a coating fluid for a gate insulating film suitable for lowering a temperature in a process for producing an organic transistor, a gate insulating film formed from the coating fluid, and further an organic transistor prepared from the gate insulating film.

BACKGROUND ART

At present, as a substrate for a flexible device such as an electronic paper, a plastic substrate made of e.g. a polycarbonate or a polyethylene terephthalate has been studied, but there is a problem that such a substrate is likely to be slightly expanded/shrunk when heated, and accordingly it is acutely desired to improve the heat resistance. On the other hand, in order to reduce a thermal stress applied to a plastic substrate, it has been studied to lower the temperature in a process for producing an organic transistor. One of process steps requiring the highest temperature in the production of an organic transistor, is a step for forming a gate insulating film, in which the temperature is desired to be lowered.

As a process for forming a gate insulating film at a lower temperature, e.g. a process for anodic oxidation of the surface of gate electrode (Patent Document 1) or a chemical vapor deposition process (Patent Document 2) has been proposed, but such a process is cumbersome, and therefore it is desired to employ a material which can readily be formed into a film by coating, such as spin coating or printing method.

On the other hand, as an example of preparing a gate insulating film by coating, firstly, an example may be mentioned, in which poly-4(vinyl phenol) and poly (melamine-formaldehyde) are cured at 200° C. (Non-Patent Document 1). However, in this example, the baking temperature is high at a level of 200° C., and at such a temperature, the influence over the heat-expansion or shrinkage of a plastic substrate will be remarkable, whereby it becomes difficult to prepare an electronic paper having fine pixels. Further, another example may be mentioned, in which a polyimide precursor curable at a low-temperature is baked at 180° C. (Non-Patent Document 2). However, this example mentions a polyimide simply and discloses no specific structures of the polyimide. Further, a leak current density is disclosed to be at least $1\times10^{-9}$ A/cm$^2$ at 2 MV/cm, and the insulation properties are still insufficient.

Further, Patent Document 3 discloses a polyimide obtained by imidation of a polyimide precursor made of cyclobutene tetracarboxylic acid dianhydride and a specific diamine having a hexafluoropropylidene group in its molecule, discloses that it is possible to obtain a polyimide film having excellent transparency not only in the visible portion but also in the ultraviolet portion even in the baking at a high temperature of from 270 to 350° C., and discloses that such a polyimide film is suitably used for e.g. a protective film for a liquid crystal display device or a semiconductor device, an insulating film or an optical waveguide material for optical communication. Further, in Examples thereof, a polyimide precursor obtained from 2,2'-bis(3-methyl-4-aminophenyl) hexafluoropropane and cyclobutane tetracarboxylic acid dianhydride, is baked at 300° C. to form a polyimide film. However, Patent Document 3 is silent about formation of a polyimide film by a low-temperature baking suitable for a gate insulating film, and therefore there is no disclosure at all which may suggest a structure of a polyamide precursor or its relation with e.g. film-forming conditions, for obtaining a polyimide film having a good film quality by a low-temperature baking.

Patent Document 1: JP-A-2003-258260
Patent Document 2: JP-A-2004-72029
Patent Document 3: WO2000/22049
Non-Patent Document 1: "Journal of Applied Physics (J. Appl. Phys.)" Vol. 93, No. 5, 1 Mar. 2003, p. 2997-2981
Non-Patent Document 2: "Applied Physics Letters (Appl. Phys. Lett.)" Vol. 84, No. 19, 10 May 2004, p. 3789-3791

DISCLOSURE OF THE INVENTION

Objects to be Accomplished by the Invention

An object to be accomplished by the present invention is to make it possible for a gate insulating film in an organic transistor excellent in properties, to facilitate film-formation by coating and to be baked at a low temperature.

Accordingly, it is an object of the present invention to provide a coating fluid for a gate insulating film, which can be baked at a temperature of at most 180° C. in consideration of the heat resistance of a plastic substrate; and a gate insulating film which can simply be formed by coating and further be baked at a low temperature, specifically, at a temperature of at most 180° C. in consideration of the heat resistance of a plastic substrate, further which is excellent in the solvent resistance to a solvent to be used at the time of lamination of an organic semiconductor on an upper layer of a gate insulating film in a case where such lamination is required when the device-preparation process is carried out entirely by coating, and furthermore which has excellent properties from the viewpoint of the specific resistance, semiconductor mobility, etc. Further, it is an object of the present invention to provide an organic transistor employing the gate insulating film.

Means to Accomplish the Objects

In order to accomplish high specific resistance by a low-temperature baking, it is considered to be the best means to use a material made mainly of a soluble polyimide requiring no thermal imidation. However, since the solubility tends to be low if the imidated ratio becomes high, it is necessary to use a polyimide excellent in the solubility so as to accomplish high solubility even in a high imidated ratio.

Further, if a high-boiling point solvent is used as a solvent to let a polyimide dissolve therein, it is necessary to carry out baking at a high temperature since it is required to carry out baking at almost the same temperature as the boiling point so as to completely volatilize the solvent, and therefore the polyimide is desired to be dissolved in a low-boiling point solvent.

Further, in addition, it is necessary to consider the balance between the solubility in a low-boiling point solvent and the resistance to a solvent at the time of coating an organic semiconductor.

The present invention has been made under such circumstances, and provides the following.

1. A coating fluid for a gate insulating film, which comprises a polyimide obtainable by cyclodehydration of a polyamic acid having repeating units represented by the following formula (1), and which can be baked at a temperature of at most 180° C., preferably at most 150° C.

2. A gate insulating film made of a polyimide film, wherein the polyimide film is a film obtained by applying and baking a solution containing an organic solvent-soluble polyimide, and further the organic solvent-soluble polyimide is a polyimide obtained by cyclodehydration of a polyamic acid having repeating units represented by the following formula (1), and the baking temperature for the polyimide film is at most 180° C., preferably at most 150° C.,

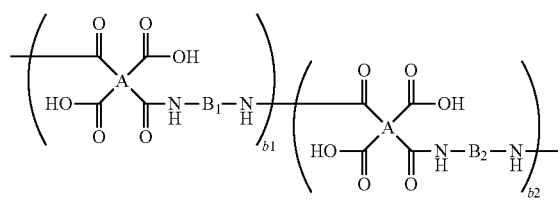
(1)

wherein A is a tetravalent organic group, $B_1$ is at least one bivalent organic group selected from the structures represented by the following formulae (2) to (9), and $B_2$ is a bivalent organic group other than the following formulae (2) to (9):

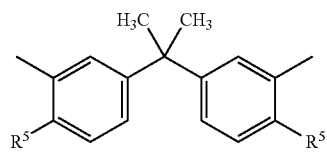
(2)

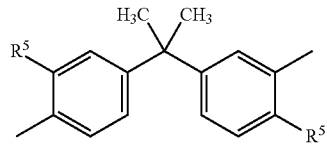
(3)

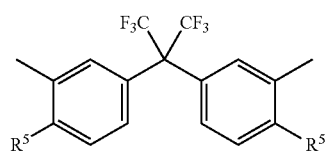
(4)

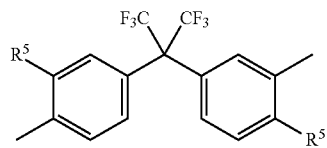
(5)

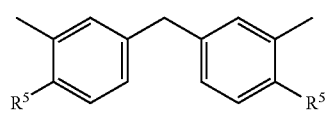
(6)

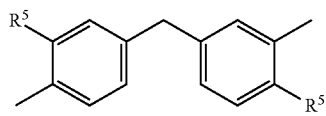
(7)

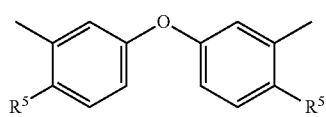
(8)

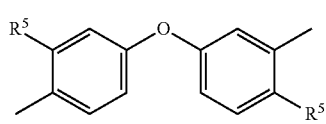
(9)

(wherein each $R^5$ independently is a hydrogen, a methyl group or a trifluoromethyl group), each of b1 and b2 represents a compositional ratio, and b1 and b2 have a relationship of $0.5 \leq (b1/(b1+b2)) \leq 1$ in ratio (mol).

3. In the formula (1), A is preferably a tetravalent organic group having an alicyclic structure.

4. The tetravalent organic group having an alicyclic structure is preferably at least one member selected from the group consisting of the following formulae (10) to (14):

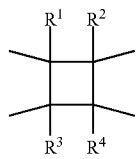
(10)

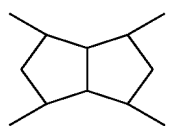
(11)

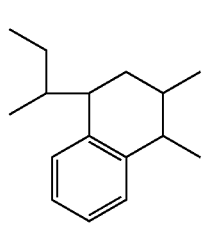
(12)

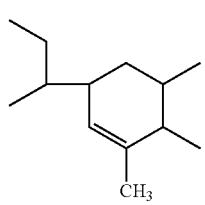
(13)

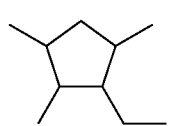
(14)

(in the formula (10), each of $R^1$, $R^2$, $R^3$ and $R^4$ which are independent of one another, is hydrogen, fluorine or a $C_{1-4}$ organic group.)

5. In the formula (1), $B_1$ preferably represents the above formula (2), (4), (6) or (8).
6. In the formula (1), $R_5$ in $B_1$ preferably represents a methyl group or a trifluoromethyl group.
7. The baking temperature for the polyimide film is at most 150° C.
8. The organic solvent-soluble polyimide has an imidated ratio of at least 50%.
9. The solvent in the solution containing an organic solvent-soluble polyimide has a boiling point of at most 200° C.
10. The organic transistor of the present invention preferably employs such a gate insulating film.

Effect of the Invention

The gate insulating film of the present invention has advantages that the specific resistance is very high and a gate leak current is extremely low. Further, according to the coating fluid for a gate insulating film of the present invention, it is possible to obtain a high-quality insulating film at a baking temperature of at most 180° C., and therefore it is possible to apply the film also to a plastic substrate, whereby it is possible to achieve a low-temperature process for an organic transistor in which a gate leak current is low. In such a case, it is possible to form a film even by baking at 150° C. by selecting a low-boiling point solvent.

Further, the amount of degas can be reduced and a long-term reliability of an organic transistor is also excellent. Further, the resistance to a solvent such as xylene, trichlorobenzene and trimethylbenzene is secured, and therefore it is possible to form an organic semiconductor layer by coating.

MEANINGS OF SYMBOLS

Figure 1:
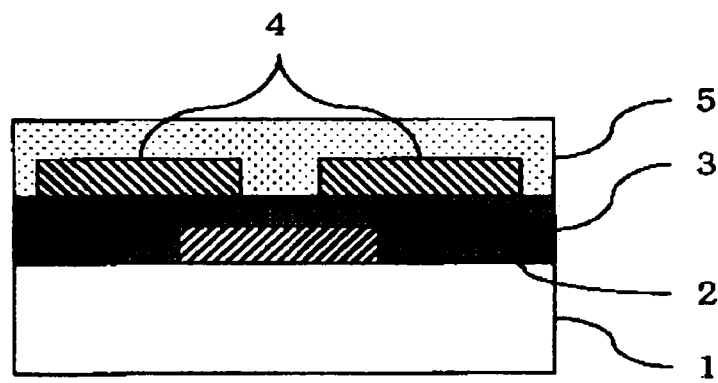
FIG. 1 is a schematic cross-sectional view of an organic transistor illustrating an application example of the gate insulating film of the present invention.

1: Substrate
2: Gate Electrode
3: Gate Insulating Film
4: Source Electrode and Drain Electrode
5: Organic Semiconductor Layer

BEST MODE FOR CARRYING OUT THE INVENTION

The gate insulating film of the present invention is made of a polyimide film, and the polyimide film is a film obtained by applying and baking a solution containing an organic solvent-soluble polyimide obtained by cyclodehydration of a polyamic acid having repeating units represented by the following formula (1), as a coating fluid for a gate insulating film,

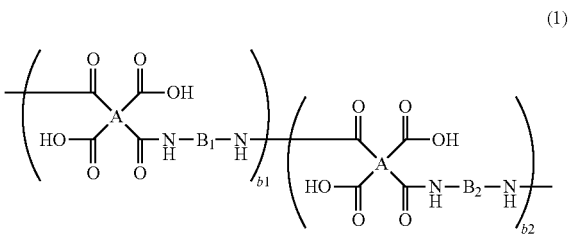

(1)

wherein $B_1$ is at least one bivalent organic group selected from the following formulae (2) to (9), and $B_2$ is a bivalent organic group other than the following formulae (2) to (9):

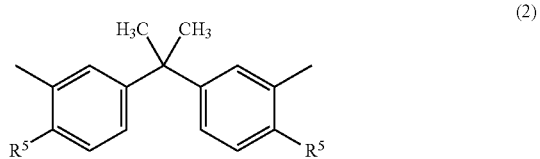

(2)

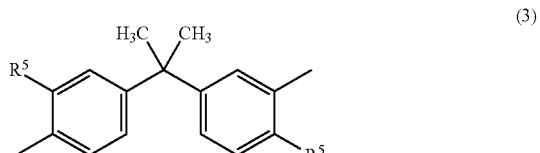

(3)

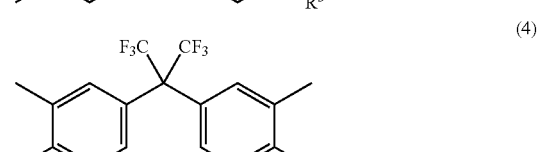

(4)

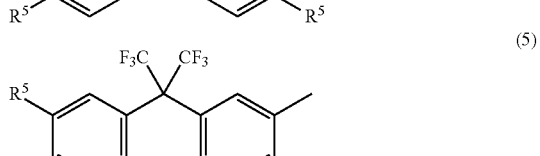

(5)

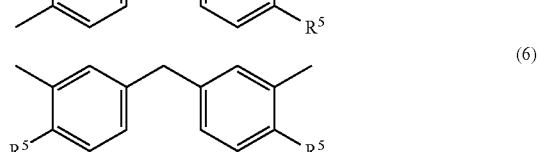

(6)

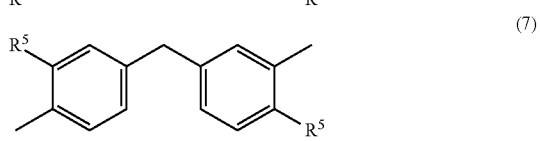

(7)

(8)

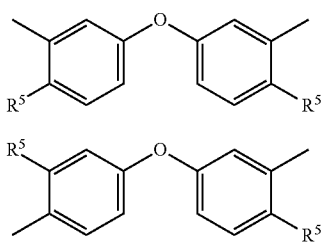

(9)

wherein each $R^5$ independently is hydrogen, a methyl group or a trifluoromethyl group. In the formulae, two $R^5$s are usually the same, but may be different.

The feature of the structures of the formulae (2) to (9) for $B_1$ in the formula (1) lies in that two phenyl groups being present so as to have one carbon atom or oxygen atom therebetween, are bonded to a polymer chain at 3,3'- or 3,4'-positions.

A polyimide having such bivalent organic groups has excellent solubility, has solubility in a low-boiling point solvent even when the imidated ratio is high, and further has high insulation properties.

In the case of bonding at 3,3'-positions, the solubility will be higher, such being preferred.

The substituent ($R^5$) in the above phenyl group is a hydrogen atom, a methyl group or a trifluoromethyl group, but a methyl group or a trifluoromethyl group is preferred for the purpose of increasing the solubility of the polyimide, and a methyl group is more preferred when electrical characteristics of the gate insulating film is also considered.

A group connecting two phenyl groups is an isopropylidene group, a hexafluoroisopropylidene group, a methylene group or an ether group. From the viewpoint of the solubility, a hexafluoroisopropylidene group is most preferred, and an isopropylidene group is then preferred. is From the viewpoint of the electrical characteristics of the gate insulating film, an isopropylidene group or a methylene group is preferred.

For $B_1$ in the formula (1), the structure of the formulae (2) to (9) may be one type or a mixture of plural types.

In the formula (1), each of b1 and b2 represents a compositional ratio, and b1 and b2 have a relationship of $0.5 \leq (b1/(b1+b2)) \leq 1$ in ratio (mol). Namely, the proportion of the structures of the formulae (2) to (9) as $B_1$ occupied in the total of $B_1$ and $B_2$, is preferably from 50 to 100 mol %.

The structure of $B_2$ occupying the residual 0 to 50 mol % may be one having an alicyclic structure, one having an aromatic ring structure, one having an aliphatic structure, one containing a heteroatom or an appropriate combination thereof, and thus may be not particularly limited so long as it is a bivalent organic group other than the formulae (2) to (9). Further, such a structure may be one type or a mixture of plural types. The structure and the ratio of such a portion contributes to fine adjustment of the solubility of the polyimide or various properties of a gate insulating film, and therefore determination may be made by considering such properties.

Specific examples may be the following B-1 to B-69.

B-1

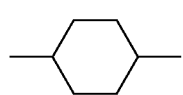

B-2

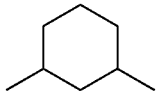

B-3

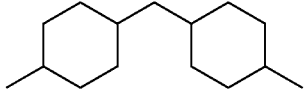

B-4

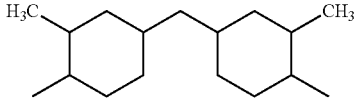

B-5

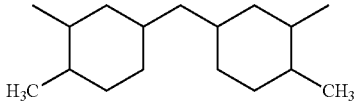

B-6

B-7

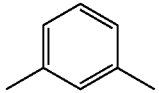

B-8

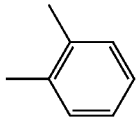

B-9

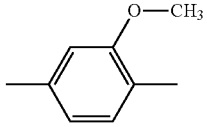

B-10

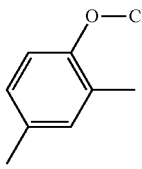

B-11

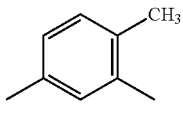

B-12

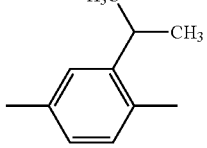

B-13

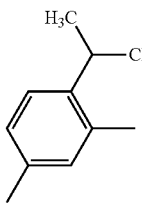

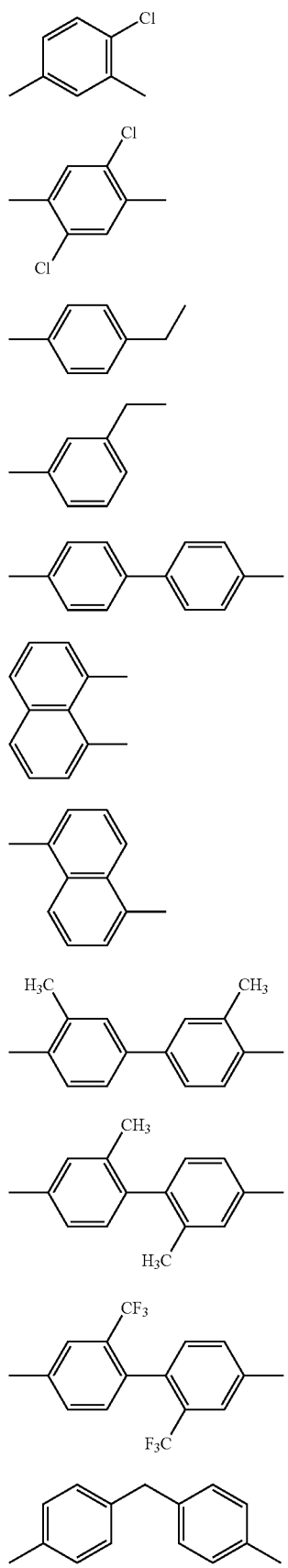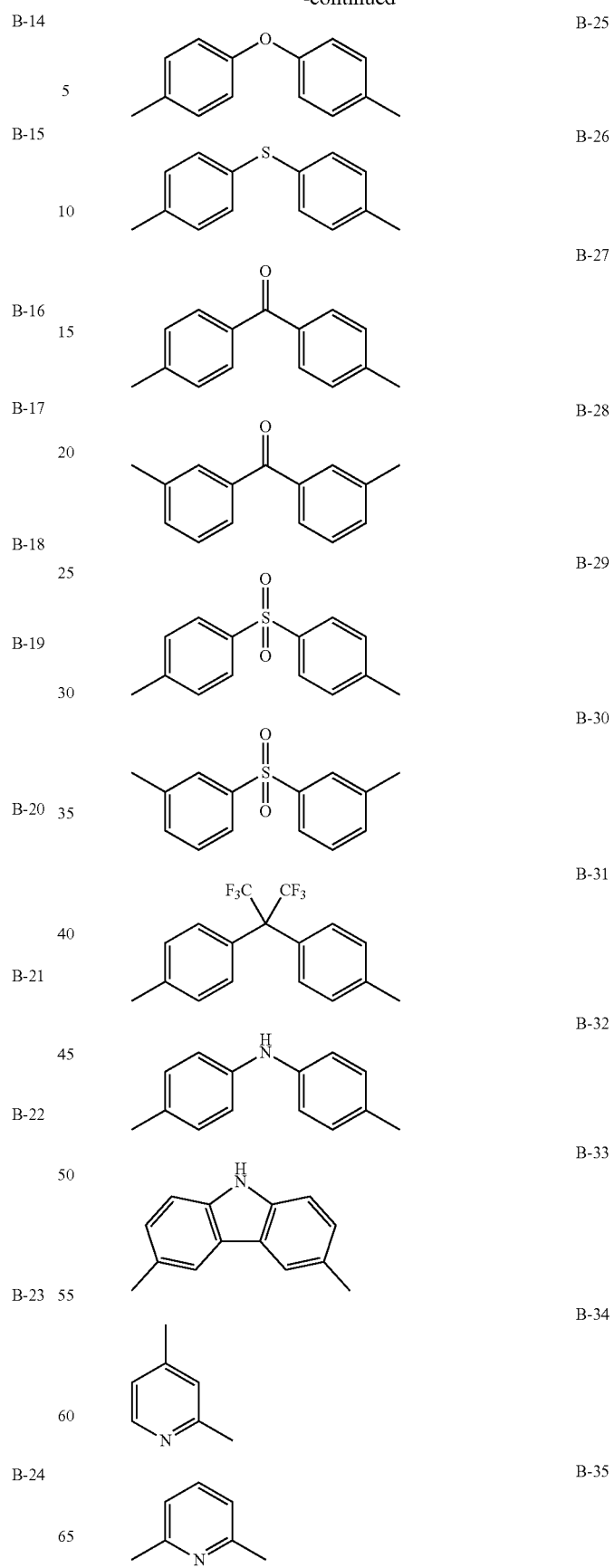

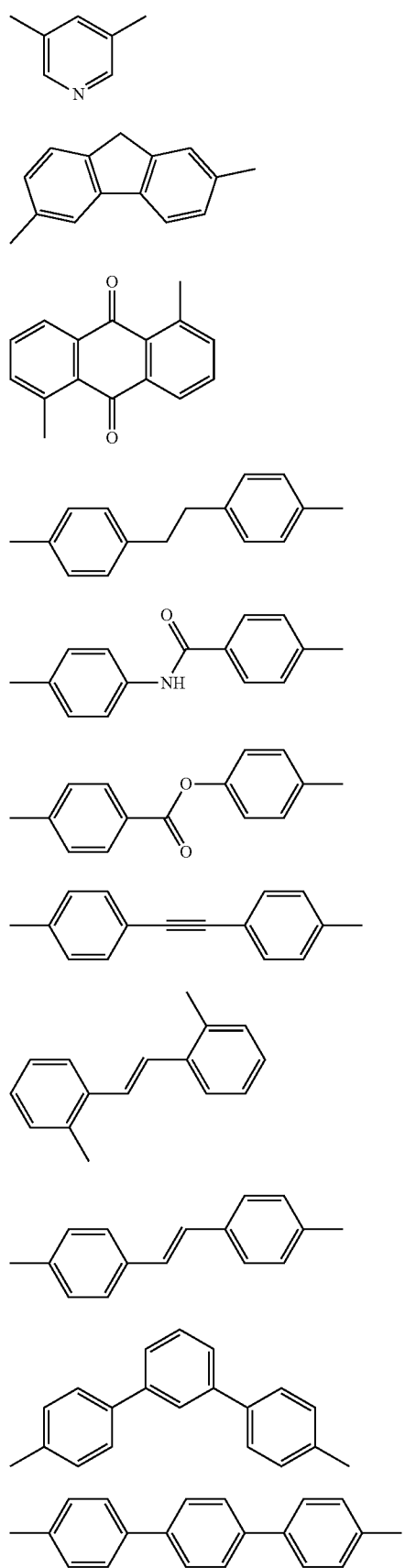
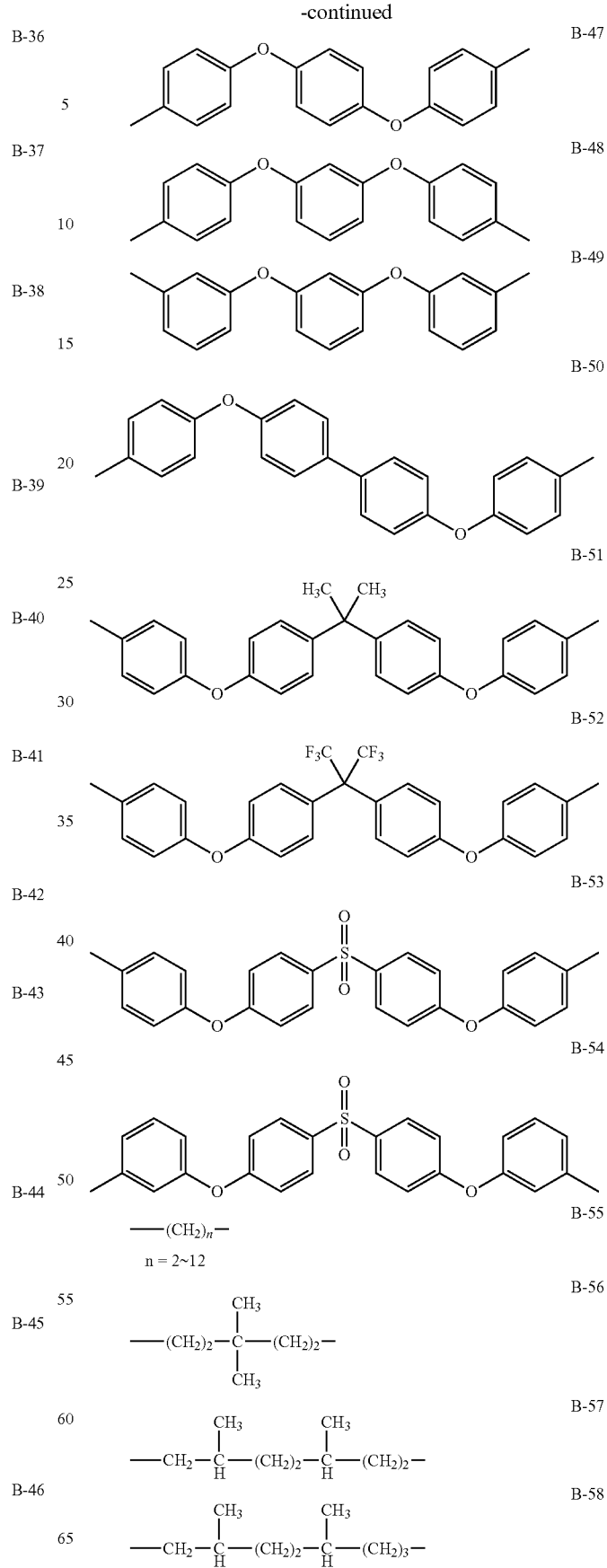

-continued

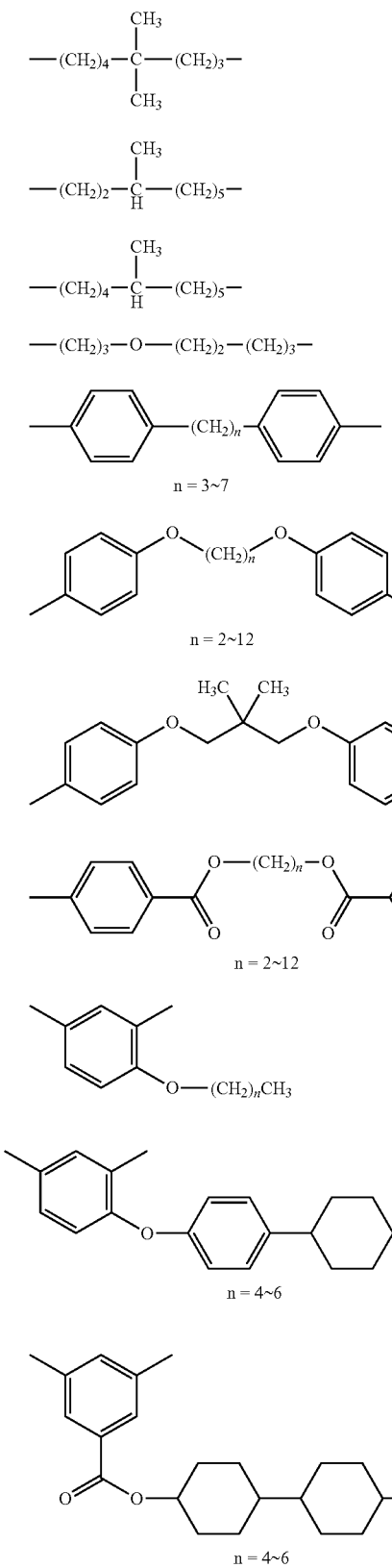

Among them, B-2, B-5, B-7, B-8, B-10, B-11, B-13, B-14, B-17, B-28, B-30, B-34, B-35, B-36, B-43, B-48, B-49, B-54, B-55 to B-69 may, for example, be mentioned as ones for increasing the solubility of the polyimide.

In the formula (1), A is a tetravalent organic group, but the structure of A is not particularly limited. The structure of A may be one type or a mixture of plural types.

Specific examples of A may be the following, such as alicyclic ones having alicyclic structures (A-1 to A-24), an aliphatic one (A-25), aromatic ones having all of four connecting bonds bonded to an aromatic group (A-26 to A-36), or others (A-37 to A-46).

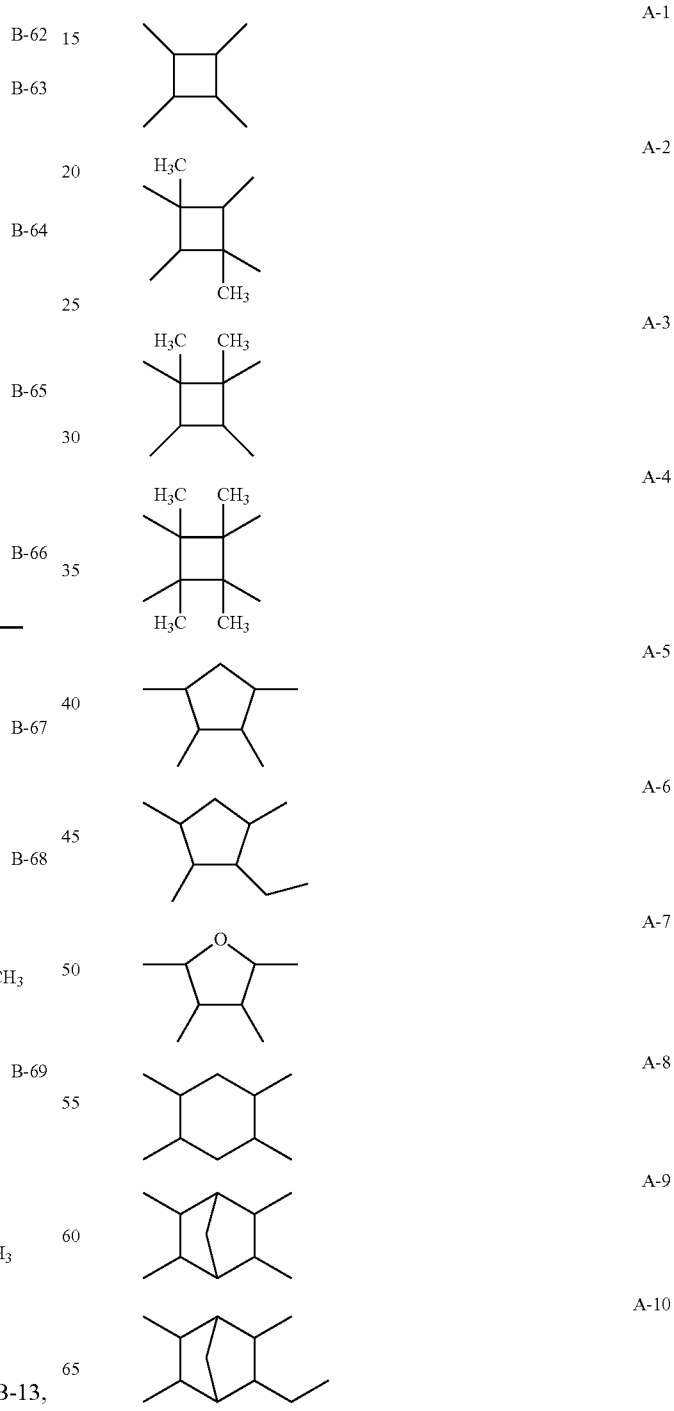

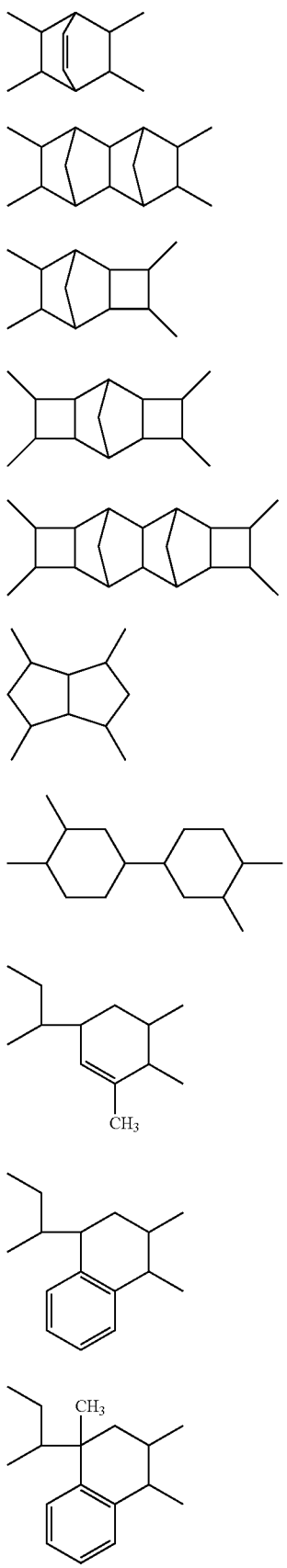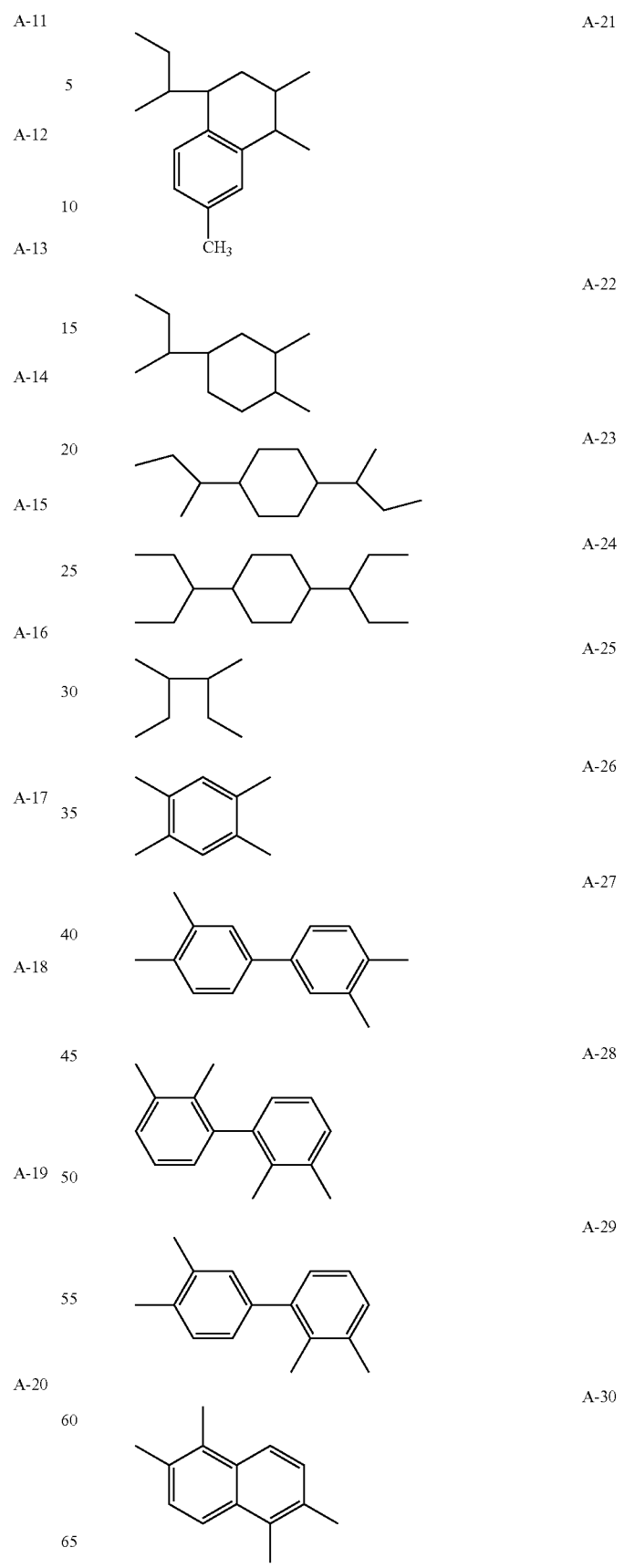

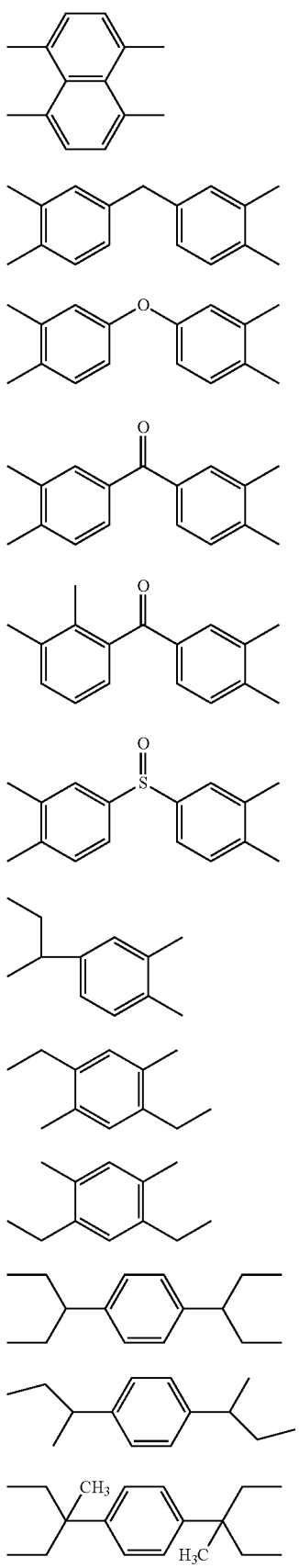
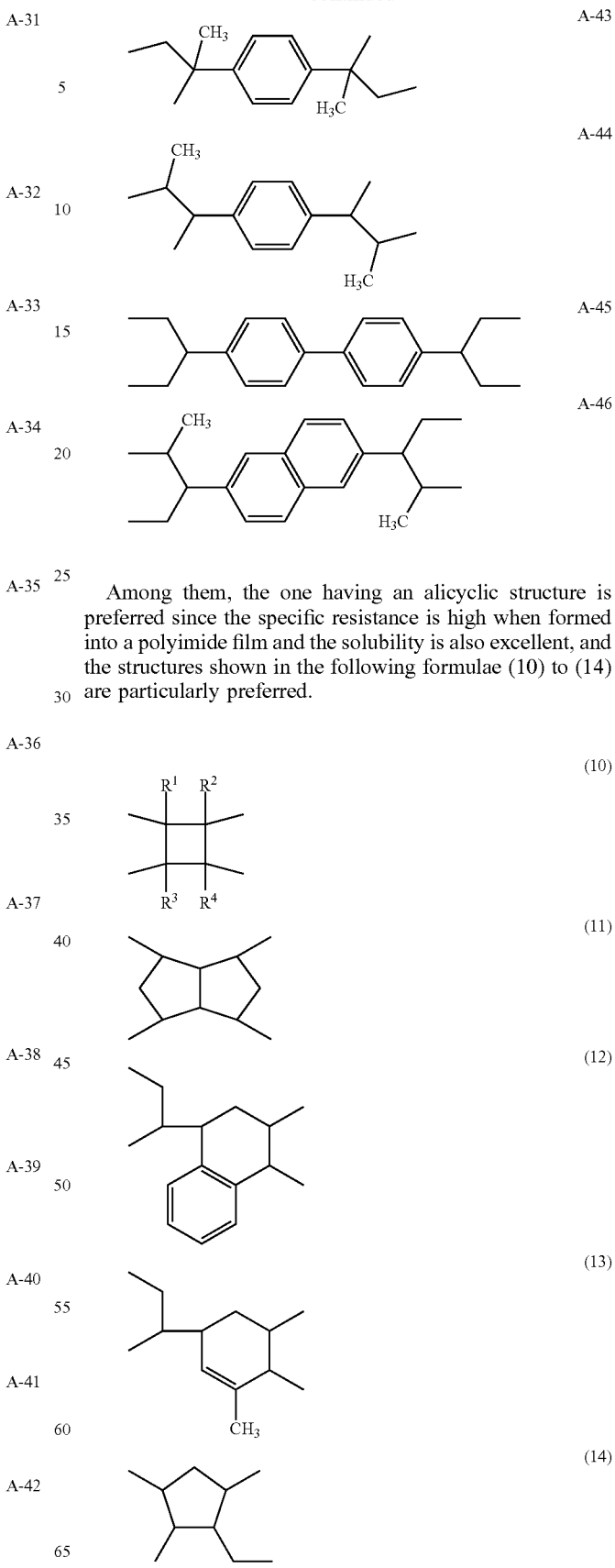
Among them, the one having an alicyclic structure is preferred since the specific resistance is high when formed into a polyimide film and the solubility is also excellent, and the structures shown in the following formulae (10) to (14) are particularly preferred.

In the formula (10), each of $R^1$, $R^2$, $R^3$ and $R^4$ which are independent of one another, is hydrogen, fluorine or a $C_{1-4}$ organic group (for example, an alkyl group such as a methyl group or an ethyl group, or a fluorinated substituent thereof). They may mutually be the same or different.

A polyamic acid may be obtained by reacting a tetracarboxylic dianhydride with a diamine. In the reaction, by using the following diamine for 50 to 100 mol % of the diamine component, it is possible to obtain a polyamic acid having the repeating units represented by the formula (1).

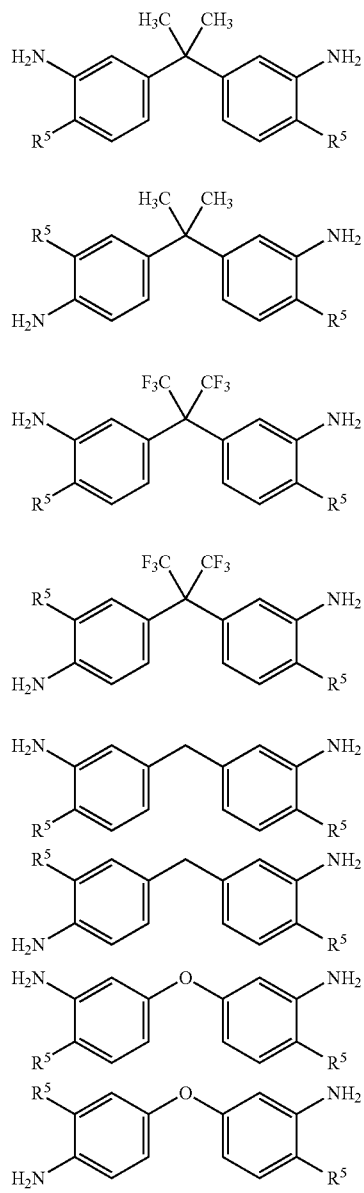

In the above formulae, each $R^5$ independently is hydrogen, a methyl group or a trifluoromethyl group, and is the same as defined in the formulae (2) to (9).

In a case where A in the formula (1) gives a polyamic acid as a structure of the above formulae (10) to (14), the following compounds may be used as a tetracarboxylic acid dianhydride.

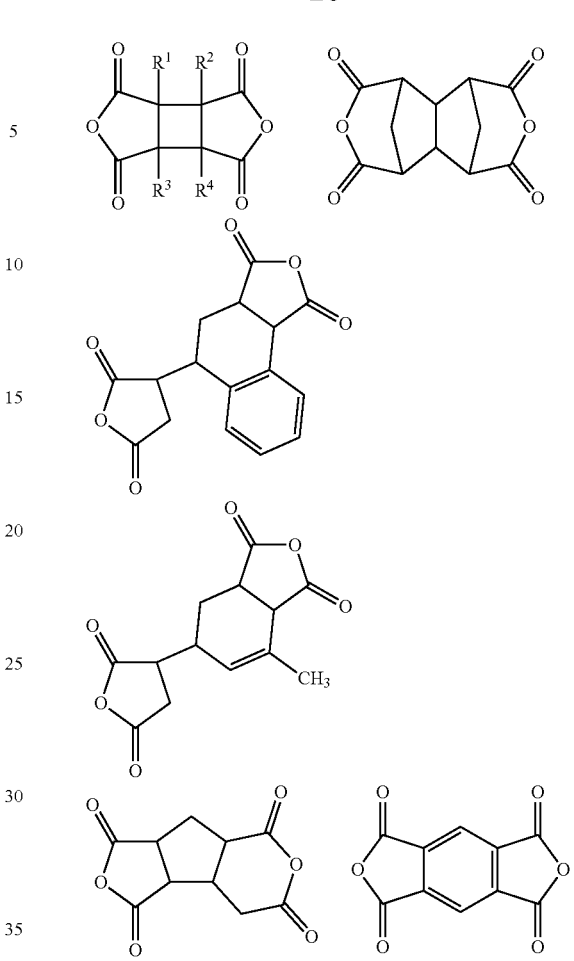

Here, each of $R^1$, $R^2$, $R^3$ and $R^4$ which are independent of one another, is hydrogen, fluorine or a $C_{1-4}$ organic group, and is the same as defined in the formula (10).

As a polymerization reaction to obtain a polyamic acid, a method of mixing a tetracarboxylic dianhydride component and a diamine component in an organic solvent is simple.

The method for mixing the tetracarboxylic dianhydride component and the diamine component in an organic solvent may, for example, be a method wherein a solution having the diamine component dispersed or dissolved in an organic solvent, is stirred, and the tetracarboxylic dianhydride component is added as it is or as dispersed or dissolved in an organic solvent, a method wherein inversely, the diamine component is added to a solution having the tetracarboxylic dianhydride component dispersed or dissolved in an organic solvent, or a method wherein the tetracarboxylic dianhydride component and the diamine component are alternately added. Further, in a case where the tetracarboxylic dianhydride component or the diamine component is composed of plural types of compounds, such plural types of the component may be subjected to polymerization reaction in a preliminarily mixed state or may be separately and sequentially subjected to the polymerization reaction.

The temperature for the polymerization reaction of the tetracarboxylic dianhydride component with the diamine component in an organic solvent is usually from −20 to 150° C., preferably from 0 to 80° C. As the temperature becomes high, the polymerization reaction will be completed quickly, but if the temperature is too is high, a polyamic acid having a high molecular weight may not sometimes be obtainable.

Further, the polymerization reaction can be carried out at an optional concentration, but if the concentration is too low, a polymer having a high molecular weight tends to be hardly obtainable, and if the concentration is too high, the viscosity of the reaction solution tends to be too high, and uniform stirring tends to be difficult. Accordingly, it is preferably from 1 to 50 mass %, more preferably from 5 to 30 mass %. At the initial stage of the polymerization reaction, the polymerization reaction may be carried out at a high concentration, and then, an organic solvent may be added.

The organic solvent to be used for the above reaction is not particularly limited so long as it is capable of dissolving the formed polyamic acid. Specific examples thereof may be N,N-dimethylformamide, N,N-dimethylacetamide, N-methyl-2-pyrolidone, N-methylcaprolactam, dimethylsulfoxide, tetramethylurea, pyridine, dimethylsulfone, hexamethylsulfoxide and γ-butyrolactone. They may be used alone or in combination as a mixture. Further, even a solvent which does not dissolve a polyamic acid, may be used as mixed to the above solvent within such a range that the formed polyamic acid will not precipitate. Further, moisture in the reaction system tends to impair the polymerization reaction and is likely to cause hydrolysis of the formed polyamic acid. Therefore, it is preferred to employ an organic solvent which has been dried to remove water. It is further preferred that the interior of the reaction system is kept to be a nitrogen atmosphere, and it is further preferred to carry out the reaction while bubbling nitrogen in the solvent in the reaction system.

The ratio of the tetracarboxylic dianhydride component to the diamine component to be used for the polymerization reaction for a polyamic acid is preferably from 1:0.8 to 1:1.2 by molar ratio. As this molar ratio is close to 1:1, the molecular weight of the obtainable polyamic acid becomes large.

As the cyclodehydration (imidation) reaction to obtain a soluble polyimide, thermal imidation of directly heating the solution of a polyamic acid obtainable as described above, as it is, or chemical imidation of adding a catalyst to the solution of a polyamic acid, is common, but the chemical imidation wherein the imidation reaction proceeds at a relatively low temperature, is preferred, since a decrease in the molecular weight of the obtainable soluble polyimide is less likely to occur.

The chemical imidation may be carried out by stirring the polyamic acid in an organic solvent in the presence of a basic catalyst and an acid anhydride for from 1 to 100 hours.

The basic catalyst may, for example, be pyridine, triethylamine, trimethylamine, tributylamine or trioctylamine. Among them, pyridine is preferred, since it has a proper basicity to let the reaction proceed.

The acid anhydride may, for example, be acetic anhydride, trimellitic anhydride or pyromellitic anhydride. Among them, acetic anhydride is preferred, since purification of the obtained polyimide will be easy after completion of the imidation.

As the organic solvent, it is possible to use a solvent which is used at the time of the above-described polymerization reaction for a polyamic acid.

A solution of the soluble polyimide obtained as the above may be used for preparation of a gate insulating film, as it is, but is preferably used after a polyimide is recovered/washed by the following procedure.

A reaction solution is put into a poor solvent being stirred to reprecipitate a polyimide. The poor solvent to be used at that time is not particularly limited, and it may, for example, be methanol, hexane, heptane, ethanol, toluene and water.

The polyimide obtained by the reprecipitation may be filtered and recovered and then washed with the above poor solvent, and then dried at room temperature or under heating under atmospheric pressure or reduced pressure to obtain a powder. When an operation of further dissolving this powder in a good solvent, followed by reprecipitation is repeated from 2 to 10 times, whereby impurities in the polymer become less. Further, as the poor solvent in such a case, it is preferred to employ at least three poor solvents such as alcohols, ketones and hydrocarbons, whereby the purification efficiency will be more increased.

The molecular weight of the polyamic acid to be used in the present invention is preferably from 2,000 to 200,000, more preferably from 5,000 to 50,000 by weight average molecular weight from the viewpoint of the handling efficiency, the solubility in a solvent, the solvent resistance to a nonpolar solvent and the stability of characteristics when formed into a film. Such a molecular weight is most preferably from 10,000 to 50,000. The molecular weight is one obtained by means of GPC (gel permeation chromatography).

The imidated ratio of the soluble polyimide to be used in the present invention, may not necessarily be 100%.

There is a case where the solubility of a polyimide becomes insufficient if the imidated ratio is high, and in such a case, the imidated ratio may be lowered.

However, if amic acid is remained, there is a case where water is produced by cyclodehydration during heating, and the imidated ratio is desirably high. Also from the viewpoint of high insulation properties, the imidated ratio is preferably high.

Accordingly, the imidated ratio of the soluble polyimide in the present invention is preferably at least 50%, more preferably at least 80%, particularly preferably at least 90%. The imidated ratio is one obtained in such a manner that the polyimide is dissolved in $d_6$-DMSO (dimethylsulfoxide-$d_6$), and $^1$H-NMR was measured, whereupon the ratio of remaining amic groups to a theoretical value of amic groups not being imidated at all is obtained from the integrated values of proton peaks, and all of amic groups disappeared is caluculated as one changed to imide groups.

The solution of the soluble polyimide as a coating fluid for a gate insulating film is prepared as follows.

The soluble polyimide obtained as described above is dissolved in an optimum solvent. The soluble polyimide may be used alone or in combination as a mixture of two or more of them.

The solvent for a coating fluid is not particularly limited so long as it is possible to dissolve the polyimide, but is preferably one having a low boiling point for the purpose of reducing a solvent remained in a polyimide film.

The lower the amount of the residual solvent is, the more the long-term reliability of an organic transistor improves.

The boiling point is preferably at most 200° C., more preferably at most 180° C., furthermore preferably at most 160° C., most preferably at most 150° C.

Further, in a case of an amide type polar solvent, such a solvent is likely to remain in a film even with a low boiling point, due to e.g. interaction with imide groups of a soluble polyimide or remaining amic acid groups without being imidated, and e.g. a glycol type solvent, a lactate type solvent or a ketone type solvent is more preferred. Specific examples of such solvents include ethyl cellosolve (135° C.), butyl cellosolve (171° C.), ethylene glycol monomethyl ether acetate (156° C.), ethyl carbitol (193° C.), ethyl carbitol acetate and ethylene glycol (196 to 198° C.); propylene glycol derivatives such as propylene glycol monomethyl ether (119° C.), 1-ethoxy-2-propanol (132° C.), 1-butoxy-2-propanol (133° C.), propylene glycol diacetate (190 to 191° C.) propylene glycol-1-monomethyl ether-2-acetate (146° C.), propylene glycol-1-monoethyl ether-2-acetate (158° C.), dipropylene glycol methyl ether (190° C.) and 2-(2-ethoxypropoxy)propanol (198° C.); lactic acid derivatives such as methyl lactate (144° C.), ethyl lactate (154° C.), n-propyl lactate, n-butyl lactate (185 to 187° C.) and isoamyl lactate; and acetone (56° C.), methyl-n-butyl ketone (144° C.), methyl-n-amyl ketone (152° C.) and cyclohexanone (156° C.) (here, values in parentheses represent boiling points of solvents, respectively.)

Further, they may be used alone or in combination as a mixture of two or more of them for securing the flatness of the coating film, for improving the wettability of the substrate with the coating fluid or for the purpose of e.g. adjusting the surface tension, polarity and boiling point of the coating fluid.

The concentration of the coating fluid is not particularly limited, but is preferably from 0.1 to 30 mass %, more preferably from 40 to 20 mass %, as a polymer component. Such a concentration may optionally be set depending upon specifications of a coating device or a thickness of a film to be obtained.

To the coating fluid, an additive such as a coupling agent may be added for the purpose of improving the adhesion between the polyimide film and the substrate.

Specific examples of such a coupling agent include 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidepropyltrimethoxysilane, 3-ureidepropyltriethoxysilane, N-ethoxycarbonyl-3-aminopropyltrimethoxysilane, N-ethoxycarbonyl-3-aminopropyltriethoxysilane, N-trimethoxysilyl propyltriethylene triamine, N-triethoxysilyl propyltriethylene triamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, N-bis(oxyethylene)-3-aminopropyltriethoxysilane, ethylene glycol diglycidyl ether, polyethylene glycol diglycidyl ether, propylene glycol diglycidyl ether, tripropylene glycol diglycidyl ether, polypropylene glycol diglycidyl ether, neopentyl glycol diglycidyl ether, 1,6-hexanediol diglycidyl ether, glycerol diglycidyl ether, 2,2-dibromoneopentyl glycol diglycidyl ether, 1,3,5,6-tetraglycidyl-2,4-hexanediol, N,N,N',N'-tetraglycidyl-m-xylenediamine, 1,3-bis(N,N-diglycidylaminomethyl)cyclohexane and N,N,N',N'-tetraglycidyl-4,4'-diaminodiphenylmethane.

The content of such a functional silane-containing compound or an epoxy group-containing compound is preferably from 0.1 to 30 mass %, more preferably from 1 to 20 mass %, based on the total polymer mass in the coating fluid.

The solution of the soluble polyimide is applied and baked as follows.

The solution of the soluble polyimide may be applied by a dipping method, a spin coating method, a transfer printing method, a roll coating method, an ink jetting method, a spraying method or a brush-coating method, and uniform film forming is possible by the respective methods.

The baking method after the coating fluid is applied on the substrate is not particularly limited, but it can be carried out by means of a hot plate or an oven in a suitable atmosphere i.e. in atmospheric air, an inert gas such as nitrogen or in vacuum.

The baking temperature is at most 180° C., preferably at most 150° C. in order to evaporate the solvent and from the viewpoint of coating with a plastic substrate. The lower limit of the baking temperature is not particularly limited, but is usually about 40° C. from the viewpoint of the evaporation of the solvent. Further, the baking time may usually be about 0.5 to 5 hours. The baking may be carried out by at least two-step temperature change. By baking step-by-step, it is possible to further increase the uniformity of the coating film.

In a case where the imidated ratio of a soluble polyimide contained in the coating fluid is less than 100%, the imidated ratio may be increased by this baking.

The gate insulating film of the present invention is a polyimide film obtained as mentioned above. If the gate insulating film is too thin, dielectric breakdown occurs in low electric fields, whereby such a film does not operate as a transistor, and if it is too thick, high voltage is required to operate a transistor, and therefore the thickness is preferably from 5 to 5,000 nm, more preferably from 50 to 1,000 nm, most preferably from 200 to 600 nm.

In a case where it is impossible to obtain a polyimide film having a desired thickness by a single coating operation, the coating operation may be repeated a plurality of times.

Figure 2:
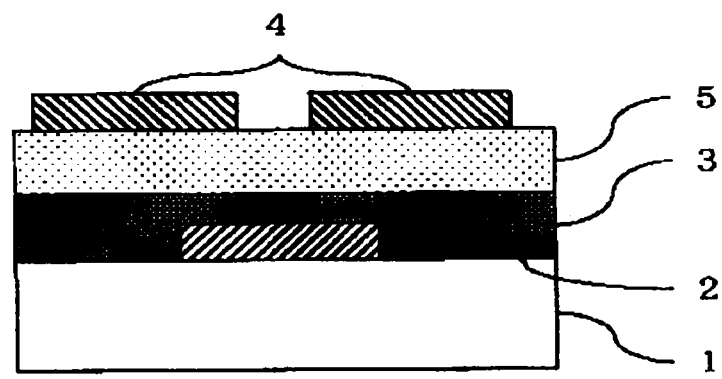
FIG. 2 is a schematic cross-sectional view of an organic transistor illustrating an application example of the gate insulating film of the present invention.

FIG. 1 and FIG. 2 show examples of construction of an organic transistor using the gate insulating film of the present invention.

As shown in the figures, in the organic transistor of the present invention, the gate electrode 2 is formed on the substrate 1, and the gate electrode 2 is covered with the gate insulating film 3 of the present invention. In the example of FIG. 1, the source electrode 4 and the drain electrode 4 are placed on the gate insulating film 3, and the organic semiconductor layer 5 is formed so as to cover them.

On the other hand, in the example of FIG. 2, the organic semiconductor layer 5 is formed on the gate insulating film 3, and on the organic semiconductor layer 5, the source electrode 4 and the drain electrode 4 are placed.

Such a construction is not limited to the above examples, and the organic transistor of the present invention is not particularly limited so long as the gate insulating film of the present invention is used for the organic transistor.

As a substrate to be used for the organic transistor of the present invention, plastics such as polycarbonate and polyethylene terephthalate are suitable for the reason that the mechanical flexibility is excellent.

The gate electrode, the source electrode and the drain electrode may, for example, be made of a metal such as gold, silver, copper, aluminum or calcium, an inorganic material such as carbon black, a fullerene or carbon nanotube; or an organic π conjugate polymer such as polythiophene, polyaniline, polypyrrole, polyfluorene or derivatives thereof.

Such electrode materials may be used alone or in combination with a plurality of them, and different materials may be used for the gate electrode, the source electrode and the drain electrode, respectively.

As a method for forming such electrodes, e.g. vacuum deposition or sputtering is usually employed. In the case of a nanometal ink or an organic π conjugate polymer, it is possible to form an electrode by coating such as spin coating, spray coating, printing or ink jetting, such being preferred.

At the time of forming an electrode by coating, as a solvent for a nanometal ink or an organic π conjugate polymer, water or a variety of alcohols are preferred since such a solvent can reduce damages to the gate insulating film of the present invention. Further, a is polar solvent such as N,N-dimethylformamide, N,N-dimethylacetamide, 2-pyrrolidone, N-methyl-2-pyrrolidone, N-ethyl-2-pyrrolidone, N-vinyl-2-pyrrolidone, N-methylcaprolactam, dimethylsulfoxide or tetramethylurea, is also preferred from the viewpoint of excellent solubility in an organic π conjugate polymer, but such a polar solvent is preferably used within a range of reducing damages to the gate insulating film of the present invention.

As an organic semiconductor material, pentacene, oligothiophene, triphenylamine, polythiophene or derivatives thereof may, for example, be mentioned, and as a film-forming method, spin coating, spray coating, printing or ink jetting may, for example, be mentioned. At that time, a solvent for the organic semiconductor is not particularly limited so long as it is possible to dissolve or uniformly disperse it, and it is possible to reduce damages to the gate insulating film of the present invention.

For example, xylene, trichlorobenzene or trimethylbenzene may be mentioned.

Now, the present invention will be described in further detail with reference to Examples and Comparative Examples, but it should be understood that the present invention is by no means limited thereto.

EXAMPLE 1

Firstly, Preparation Examples of the soluble polyimide of the present invention are given together with Comparative Preparation Example.

In this Example, the molecular weight of a soluble polyimide was measured by a GPC (gel permeation chromatography) apparatus (SSC-7200, manufactured by Senshu Scientific co., ltd.). At that time, the column temperature of a GPC column (KD-803/KD-805, manufactured by SHOWA DENKO K.K.) was 50° C., an eluant to be used was N,N-dimethylformamide (as additives, 30 mmol/L of lithium bromide monohydrate ($LiBr \cdot H_2O$), 30 mmol/L of phosphoric anhydride crystal (o-phosphoric acid), and 10 ml/L of tetrahydrofuran (THF) were contained), and the flow rate was 1.0 ml/min.

Standard samples for preparing calibration curves to be used, were TSK standard polyethylene oxides (molecular weights: about 900,000, 150,000, 100,000, 30,000) manufactured by TOSOH CORPORATION, and polyethylene glycols (molecular weights: about 12,000, 4,000, 1,000) manufactured by Polymer Laboratories Ltd.

Further, for the imidated ratio of a soluble polyimide, the polyimide was dissolved in $d_6$-DMSO (dimethylsulfoxide-$d_6$), and $^1$H-NMR was measured, whereupon the ratio of amic groups remaining without being imidated was obtained from the integrated values of proton peaks, and the imidated ratio was calculated.

PREPARATION EXAMPLE 1

Preparation of Soluble Polyimide (PI-1)

In a nitrogen stream, into a 200 ml four-necked flask, 18.45 g (0.051 mol) of 2,2-bis(3-amino-4-methylphenyl)hexafluoropropane was put and dissolved in 75.92 g of N-methyl-2-pyrrolidone (hereinafter referred to simply as "NMP") and then, 9.48 g (0.048 mol) of 1,2,3,4-cyclobutane tetracarboxylic dianhydride was added. The mixture was stirred at room temperature for 8 hours to carry out a polymerization reaction. The obtained polyamic acid solution was diluted with NMP to 10 mass %. To such a solution, 26 g of acetic anhydride and 16.1 g of pyridine were added as imidation catalysts, followed by reacting at room temperature for 30 minutes and further reacting at 40° C. for 90 minutes to obtain a polyimide solution. This solution was put into a large amount of a mixed solvent of methanol and water, and the obtained white precipitate was collected by filtration and dried to obtain a white polyimide powder. This polyimide powder was confirmed to be 95% imidated by $^1$H-NMR. 4 g of this powder was dissolved in 46 g of propylene glycol monomethyl ether to obtain a 8 mass % solution of the polyimide (PI-1). The number average molecular weight (Mn) and the weight average molecular weight (Mw) of the polyimide (PI-1) obtained were Mn=8,300 and Mw=16,900, respectively.

PREPARATION EXAMPLE 2

Preparation of Soluble Polyimide (PI-2)

In a nitrogen stream, into a 200 mL four-necked flask, 2.79 g (0.0068 mol) of 2,2-bis[4-(4-aminophenoxy)phenyl]propane and 9.85 g (0.027 mol) of 2,2-bis(3-amino-4-methylphenyl)hexafluoropropane were put and dissolved in 75.92 g of NMP, and then 6.33 g (0.032 mol) of 1,2,3,4-cyclobutane tetracarboxylic dianhydride was added. The mixture was stirred at room temperature for 8 hours to carry out a polymerization reaction. The obtained polyamic acid solution was diluted with NMP to 5 mass %. To this solution, 12.8 g of acetic anhydride and 9.9 g of pyridine were added as imidation catalysts, followed by reacting at 50° C. for 3 hours to obtain a polyimide solution. This solution was put into a large amount of a mixed solution of methanol and water, and the white precipitate obtained was collected by filtration and dried to obtain a white polyimide powder. This polyimide powder was confirmed to be 95% imidated by $^1$H-NMR. 4 g of this powder was dissolved in 46 g of propylene glycol monomethyl ether to obtain a 8 mass % solution of the polyimide (PI-2). The number average molecular weight (Mn) and the weight average molecular weight (Mw) of the polyimide (PI-2) obtained were Mn=8,400 and Mw=15,100, respectively.

PREPARATION EXAMPLE 3

Preparation of Soluble Polyimide (PI-3)

In a nitrogen stream, into a 200 mL four-necked flask, 5.58 g (0.014 mol) of 2,2-bis[4-(4-aminophenoxy)phenyl]propane and 7.39 g (0.020 mol) of 2,2-bis(3-amino-4-methylphenyl)hexafluoropropane were put and dissolved in 76.7 g of NMP, and then 6.20 g (0.032 mol) of 1,2,3,4-cyclobutane tetracarboxylic dianhydride was added. The mixture was stirred at room temperature for 8 hours to carry out a polymerization reaction. The polyamic acid solution obtained was diluted with NMP to 5 mass %. To this solution, 14.8 g of acetic anhydride and 11.5 g of pyridine were added as imidation catalysts, followed by a reaction at 50° C. for 3 hours to obtain a polyimide solution. This solution was put into a large amount of methanol, and the white precipitate obtained was collected by filtration and dried to obtain a white polyimide powder. This polyimide powder was confirmed to be 95% imidated by $^1$H-NMR. 4 g of this powder was dissolved in 46 g of propylene glycol monomethyl ether to obtain a 8 mass % solution of the polyimide (PI-3). The number average molecular weight (Mn) and the weight average molecular weight (Mw) of the polyimide (PI-3) obtained were Mn=8,900 and Mw=16,100, respectively.

COMPARATIVE PREPARATION EXAMPLE 1

Preparation of Polyamic Acid (PI-4)

In a nitrogen stream, into a 200 mL four-necked flask, 8.01 g (0.04 mol) of 4,4'-diaminodiphenyl ether was put and dissolved in 91.9 g of NMP, and then 8.20 g (0.038 mol) of pyromelletic dianhydride was added. The mixture was stirred at 23° C. for two hours to carry out a polymerization reaction and further diluted with NMP to obtain a 6 mass % solution of the polyamic acid (PI-4). The number average molecular weight (Mn) and the weight average molecular weight (Mw) of the polyamic acid (PI-4) were Mn=11,200 and Mw=24,300, respectively.

Now, e.g. the structures of polyimides and polyamic acids obtained are shown below. Among them, PI-1 is one obtained from the formula (1) in which $B_1$=formula (4) [$R^5$=$CH_3$] and A=formula (10) [$R^1$, $R^2$, $R^3$, $R^4$=H].

EXAMPLE 2

In order to investigate the solubility of the polyimides (PI-1) to (PI-3) prepared in Preparation Examples 1 to 3 in a low-boiling point solvent, an experiment was carried out under the following conditions by using propylene glycol monomethyl ether (PGME), propylene glycol monomethyl ether acetate (PGMEA), methyl n-amyl ketone (MAK), cyclohexanone (CH) and ethyl lactate (EL).

Into a round flask, any one of the low-boiling point solvents was put, and a powdery PI-1 was put thereto to be 10 mass %, and stirring was carried out for 12 hours while the flask was heated in an oil bath so that the temperature of the solvent would be 50° C. PI-2 and PI-3 were also subjected to experiments under the same conditions.

The results are shown in Table 1. Further, the boiling points of solvents used are shown in Table 2. The solubility was visually evaluated, and in Table 1, "○" represents a case where an unmelted solid content was not observed, and "X" represents a case where a large amount of an unmelted solid content was observed. PI-1 and PI-2 showed good solubility in all of the solvents. Further, PI-3 was hardly dissolved in solvents other than cyclohexanone, but at least

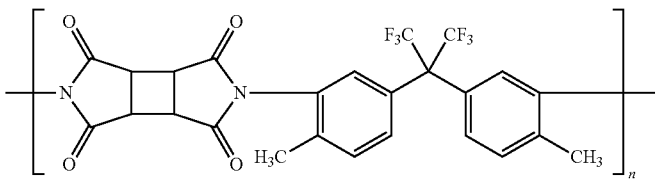

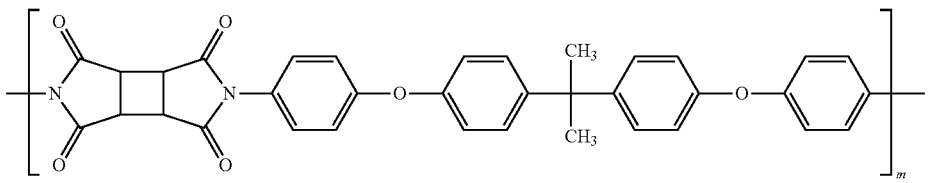

| | n/(n + m) | Imidated ratio | Molecular weight (Mw) | Molecular weight (Mn) |
|---|---|---|---|---|
| PI-1 | 1 | 95% | 16,900 | 8,300 |
| PI-2 | 0.8 | 95% | 15,100 | 8,400 |
| PI-3 | 0.6 | 95% | 16,100 | 8,900 |

Comparative Polymer

| Imidated ratio | Molecular weight (Mw) | Molecular weight (Mn) |
|---|---|---|
| 0% | 24,300 | 11,200 |

9 mass % of PI-3 was dissolved in cyclohexanone, and it was confirmed that there is no practical problem in film-formation of a gate insulating film.

It becomes apparent that the polyimide of the present invention has excellent solubility also in a low boiling point solvent.

TABLE 1

| | PGME | PGME | MAK | CH | EL |
|---|---|---|---|---|---|
| PI-1 | ○ | ○ | ○ | ○ | ○ |
| PI-2 | ○ | ○ | ○ | ○ | ○ |
| PI-3 | X | X | X | 9.1 mass % | X |

TABLE 2

| | | Boiling point (° C.) |
|---|---|---|
| PGME | Propylene Glycol Monomethyl Ether | 118-119 |
| PGMEA | Propylene Glycol Monomethyl Ether Acetate | 145-146 |
| MAK | Methyl n-Amyl Ketone | 149-150 |
| CH | Cyclohexanone | 155 |
| EL | Ethyl Lactate | 154 |

EXAMPLE 3

In this Example, the amount of degas from a polyimide film was measured by using TDS (Thermal Desorption Spectroscopy) system (WA1000S, manufactured by ESCO Ltd.), at a temperature range of from 50 to 300° C. and at a temperature-rising rate of 1° C./sec.

Degas Evaluation of PI-1 (Example)

Figure 3:
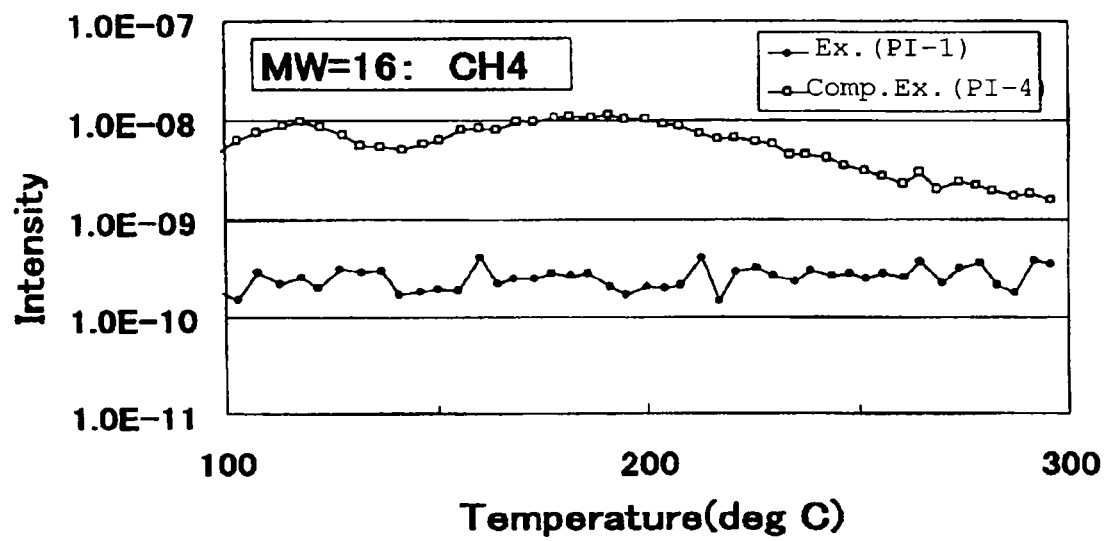
FIG. 3 is a graph showing degas intensity, at a molecular weight of 16, of a thin film obtained from the solution of each of PI-1 (EXAMPLE) and PI-4 (COMPARATIVE EXAMPLE).
Figure 4:
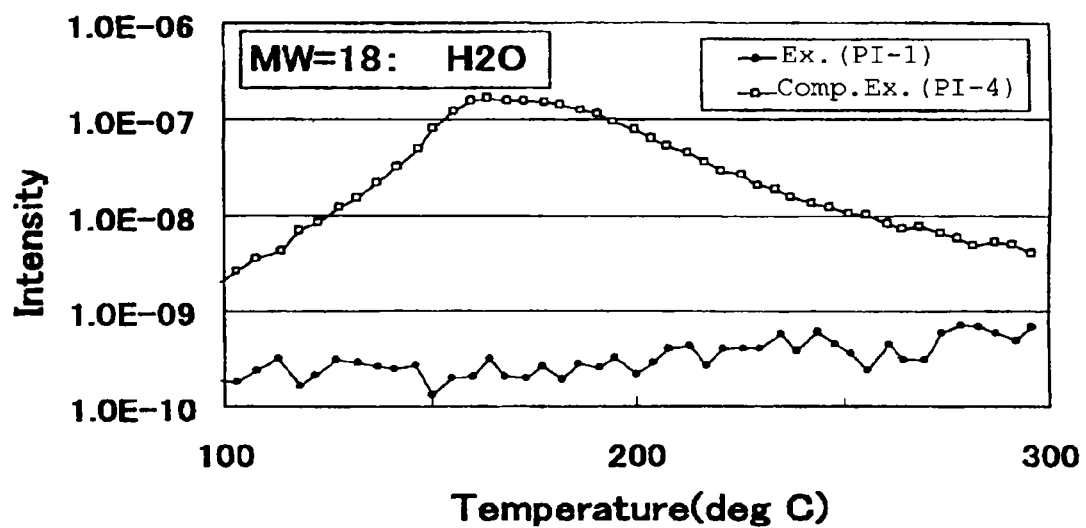
FIG. 4 is a graph showing degas intensity, at a molecular weight of 18, of a thin film obtained from the solution of each of PI-1 (EXAMPLE) and PI-4 (COMPARATIVE EXAMPLE).
Figure 5:
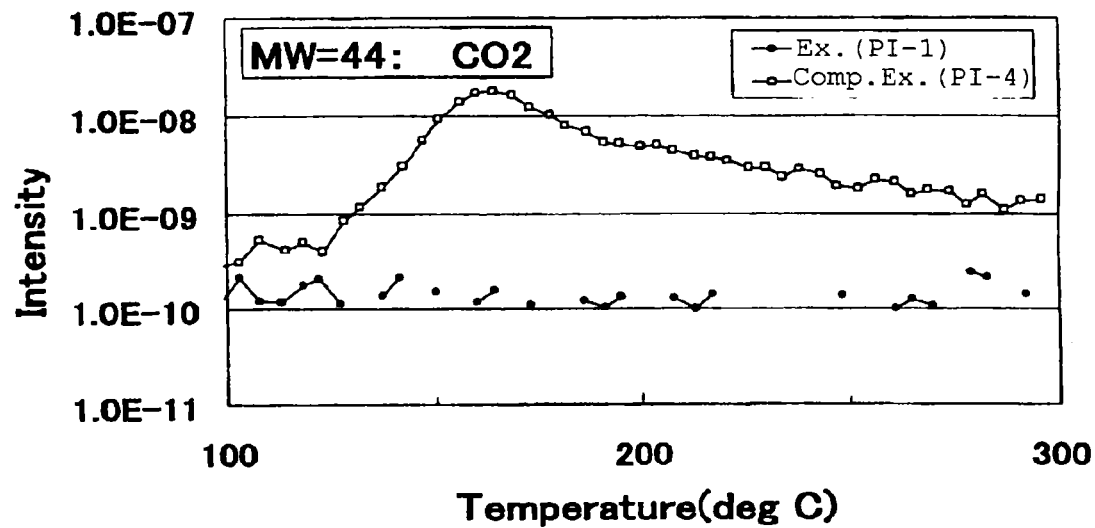
FIG. 5 is a graph showing degas intensity, at a molecular weight of 44, of a thin film obtained from the solution of each of PI-1 (EXAMPLE) and PI-4 (COMPARATIVE EXAMPLE).

On an Si wafer (thickness: 0.5 mm), the solution of PI-1 prepared in Preparation Example 1 was dropped by a syringe provided with a 0.2 μm-perforated filter and applied by a spin coating method. Then, in atmospheric air, it was heated on a hot plate of 80° C. for 5 minutes to evaporate the organic solvent and then such an Si wafer was cut into a square of 1 cm×1 cm, followed by baking for 60 minutes on a hot plate of 150° C. to obtain a polyimide film having a thickness of about 200 nm. By using TDS, the amount of degas from the thin film made of polyimide and polyamic acid was evaluated at Mw=16, 18 and 44. The evaluation results are shown in FIGS. 3 to 5. The degas from the polyimide film was hardly observed, and therefore it is considered there is an extremely low possibility that PI-1 brings about the deterioration of performance of an organic transistor due to degas.

Degas Evaluation of PI-4 (Comparative Example)

By using a solution of PI-4 prepared in Comparative Preparative Example 1, a polyimide film was formed in the same manner as in the above Example except that the film thickness was changed to 220 nm, and the amount of degas was measured by using TDS, whereupon an extremely large amount of degas was observed at all of Mw=16, 18 and 44. The evaluation results are shown in FIGS. 3 to 5. When Mw=16, an extremely large amount of degas was observed on end after the vicinity of 100° C., and therefore an adverse effect on device characteristics is concerned. Further, even when Mw=18 and 44, a peak of degas was observed in the vicinity of 160° C. Especially, $H_2O$ shown as Mw=18 is considered to accelerate deterioration of an organic semiconductor layer, and therefore it is considered there is extremely high possibility that PI-4 brings about a problem in a long-term reliability and thermal stability of an organic transistor.

EXAMPLE 4

In this Example, the film thickness of polyimide was calculated in such a manner that a film was partly removed by a cutter knife, and a difference in level was measured by using a fully automatic microfigure measuring instrument (ET4000A, manufactured by Kosaka Laboratory Ltd.), at a measurement power of 10 μN at a sweep rate of 0.05 mm/s.

Solvent Resistance of PI-1 (Example)

In order to investigate the solvent resistance of PI-1 prepared in Preparation Example 1, by using xylene, trichlorobenzene or trimethylbenzene to be usually used for dissolving an organic semiconductor polymer, experiments were conducted under the following conditions.

On an ITO-coated glass substrate (2.5 cm×2.5 cm, thickness: 0.7 mm), the solution of PI-1 prepared in Preparation Example 1 was dropped by a syringe provided with a 0.2 μm-perforated filter and applied by a spin coating method. Then it was heated on a hot plate of 80° C. for 5 minutes to evaporate the organic solvent and then baked on a hot plate of 150° C. for 60 minutes to obtain a polyimide film having a thickness of 250 nm. Then, any one solvent of xylene, trichlorobenzene and trimethylbenzene was put into 100 mL of a beaker and heated by using an oil bath so that the liquid temperature would be 80° C., and a polyimide substrate prepared as the above was immersed in the solvent for 30 minutes. Then, such a polyimide thin film substrate was dried by using an air blower to evaluate the film remaining rate.

The film remaining rate was calculated from the ratio of the film thickness before solvent treatment to the film thickness after solvent treatment. The results are shown in Table 3.

The film remaining rate of PI-1 is 104% to xylene, and therefore swelling was slightly observed, but such a level is not practically problematic. On the other hand, the film remaining rates to trichlorobenzene and trimethylbenzene are 101% and 100% respectively, and it was found that such a film is not influenced by the solvent at all. Further, no dissolution was observed in any of the solvents. Accordingly, it becomes apparent that the gate insulating film for an organic transistor of the present invention is excellent in the solvent resistance.

Solvent Resistance of PI-2 (Example)

In order to investigate the solvent resistance of PI-2 prepared in Preparation Example 2, an experiment was conducted under the same conditions as in the above except that the film thickness of polyimide was changed to 300 nm. The results are shown in Table 3.

The film remaining rate of PI-2 was 102% to xylene, and therefore swelling was slightly observed, but such a level is not practically problematic. The film remaining rates to trichlorobenzene and trimethylbenzene were 101% and 100% respectively, and it was found that such a film was not influenced by the solvent at all. Further, no dissolution was also observed in any of the solvents. Accordingly, it becomes apparent that the gate insulating film for an organic transistor of the present invention is excellent in the solvent resistance.

The Solvent Resistance of PI-3 (Example)

In order to investigate the solvent resistance of PI-3 prepared in Preparation Example 3, an experiment was conducted under the same conditions as in the above except that the film thickness of polyimide was changed to 230 nm. The results are shown in Table 3.

The film remaining rates of PI-3 were 105% and 106% to xylene and trichlorobenzene respectively, and therefore swelling was slightly observed, but such a level is not practically problematic. On the other hand, it was found that the film remaining rate was 100% to trimethylbenzene, and it was found that such a film is not influenced by the solvent at all. Further, no dissolution was also observed in any of the solvents. Accordingly, it becomes apparent that the gate insulating film for an organic transistor of the present invention is excellent in the solvent resistance.

TABLE 3

| Polyimide | Treating solvent | Film thickness of polyimide (nm) | | Film remaining rate |
|---|---|---|---|---|
| | | Before treatment | After treatment | |
| (PI-1) | Xylene | 244.2 | 253.3 | 104% |
| | Trichlorobenzene | 245.5 | 248.9 | 101% |
| | Trimethylbenzene | 246.8 | 247.2 | 100% |
| (PI-2) | Xylene | 293.1 | 299.3 | 102% |
| | Trichlorobenzene | 296.9 | 300.9 | 101% |
| | Trimethylbenzene | 297.9 | 298.4 | 100% |
| (PI-3) | Xylene | 229.6 | 241.9 | 105% |
| | Trichlorobenzene | 228.8 | 242.3 | 106% |
| | Trimethylbenzene | 229.8 | 230.3 | 100% |

EXAMPLE 5

In this example, by using HP4156C (manufactured by Agilent K.K.) and AG-4311B (manufactured by Ando electric Co., Ltd.) at 100 KHz and 1 V, the specific resistance and a relative permittivity of a polyimide film (gate insulating film) were respectively measured in such a manner that in order to remove the influence of an ambient humidity and an active material, and after completion of a device, it was rapidly moved into a nitrogen gas atmosphere and left to stand for about 10 minutes until the atmosphere was stabilized, followed by the measurement.

Evaluation of Insulating Property of PI-1 (Example)

In order to investigate insulating property of PI-1 prepared in Preparation Example 1, the specific resistance of a thin film made of polyimide and polyamic acid was measured in accordance with the following experimental procedure.

On an ITO-coated glass substrate (2.5 cm×2.5 cm, thickness: 0.7 mm), the solution of PI-1 prepared in Preparation Example 1 was dropped by a syringe provided with a 0.2 μm-perforated filter and applied by a spin coating method. Then, it was heated on a hot plate of 80° C. for 5 minutes to evaporate the organic solvent and then baked on a hot plate of 150° C. for 60 minutes to obtain a polyimide film having a thickness of about 220 nm. Then, in order to achieve good contact between an ITO electrode and a probe, the polyimide film was partly shaved to expose ITO, and an aluminium electrode having a diameter of 0.5 mm and a thickness of 100 nm was laminated on the polyimide film and the ITO by using a vacuum deposition apparatus. At that time the conditions of vacuum deposition were such that the temperature would be room temperature, the vacuum degree would be at most $3×10^{-3}$ Pa and the aluminium deposition rate would be at most 0.3 nm/sec. Thus, such electrodes are formed on and under the polyimide thin film, whereby a sample for measuring a specific resistance of a polyimide thin film was prepared.

The specific resistance was measured in a nitrogen atmosphere, in which the voltage was set to 19 V so that the applied electric field would be 1 MV/cm and the current density was measured upon expiration of 60 seconds after the voltage was applied, whereupon the current value was 0.029 to 0.070 pA. The specific resistance was calculated therefrom, whereupon the specific resistance was from $6.2×10^{15}$ to $1.5×10^{16}$ Ω·cm, and such a film was found to have sufficient insulating property as a gate insulating film for an organic transistor even when baked at 150° C.

Figure 6:
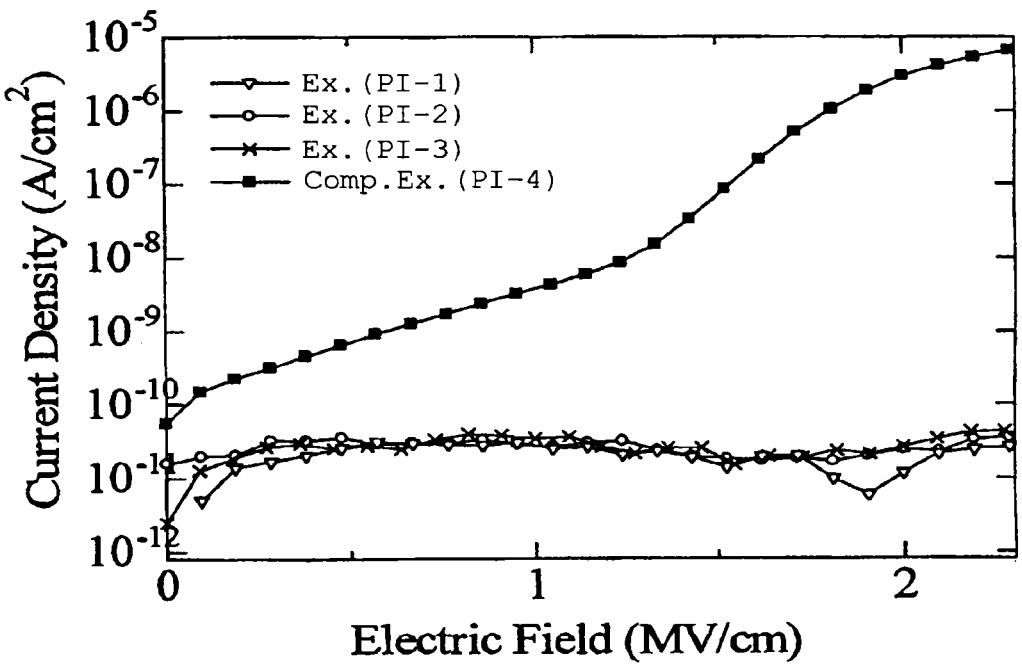
FIG. 6 is a graph showing a relationship between a current density and an electric field of a thin film obtained from the solution of each of PI-1 (EXAMPLE), PI-2 (EXAMPLE), PI-3 (EXAMPLE) and PI-4 (COMPARATIVE EXAMPLE).

Further, in order to investigate the relationship between a leak current and an electric field more detail, a voltage was applied from 0 to 50 V while stepwisely increased every 2 V for a retention time of 10 seconds, and a relationship of the current density and the electric field at that time was plotted (FIG. 6). FIG. 6 shows that the current density was merely at most $10^{-10}$ A/cm² even when a high voltage of 50 V (2.3 MV/cm) was applied, and a very excellent characteristic were shown as a gate insulating film for an organic transistor. Further, a specific permittivity of such a polyimide film was 3.0.

Evaluation of Insulating Property of PI-2 (Example)

By using a solution of PI-2 prepared in Preparation Example 2, a polyimide film was formed by the same method as in the above except that the film thickness was changed to 210 nm, whereby an element for measuring the specific resistance was prepared. The specific resistance was measured under the same conditions as in the above conditions except that the voltage was set at 21 V so that 1 MV/cm of an electric field was applied on a thin film made of PI-2. The current flown in an insulating film made of polyimide and polyamic acid obtained from a solution of PI-2 was from 0.024 to 0.066 pA, and the specific resistance calculated therefrom was from $7.6×10^{15}$ to $2.1×10^{16}$ Ω·cm. Even in a case where baking is carried out at 150° C., such a film had sufficient insulating property for the use as a gate insulating film for an organic transistor.

Further, a relationship of the current density and the electric field was plotted in the same manner as the above (FIG. 6), whereupon the current density was found to be merely at most $10^{-10}$ A/cm² even when a high voltage was applied, and therefore very excellent characteristics were shown as a gate insulating film for an organic transistor even when baking was carried out at 150° C.

Evaluation of Insulating Property of PI-3 (Example)

By using a solution of PI-3 prepared in Preparation Example 3, a polyimide film was formed in the method as in the above except that the film thickness was changed to 220 nm, whereby an element for measuring the specific resistance was prepared. The specific resistance was measured under the same conditions as in the above except that the voltage was set at 22 V so that 1 MV/cm of the electric field was applied on a thin film made of PI-3. The current flown in an insulating film made of polyimide and polyamic acid obtained from a solution of PI-2 was from 0.020 to 0.086 pA, and the specific resistance calculated therefrom was from $5.7×10^{15}$ to $2.4×10^{15}$ Ω·cm. Even when baking was carried out at 150° C., very excellent characteristics were shown as a gate insulating film for an organic transistor.

Further, a relationship of the current density and the voltage was plotted in the same manner as the above (FIG. 6), whereupon the current density was found to be merely at most $10^{-10}$ A/cm² even when a high voltage was applied, even when the baking was carried out at 150° C., very excellent characteristics were shown as a gate insulating film for an organic transistor.

Evaluation of Insulating Property of PI-4 (Comparative Example)

By using a solution of PI-4 prepared in Comparative Preparation Example 1, a polyimide film was prepared in the same manner as in the above except that the film thickness was changed to 210 nm, whereby an element for measuring the specific resistance was prepared. The specific resistance was measured under the same conditions as in the above except that the voltage was set at 22 V so that 1 MV/cm of the electric field was applied on a thin film made of PI-4. The current flown in an insulation film made of polyimide and polyamic acid, obtained from a solution of PI-4 was 7.0 pA, and the specific resistance calculated therefrom was $7.2 \times 10^{13}$ Ω·cm. In a case where an insulating film made of polyimide and polyamic acid, obtained from a solution of PI-4 was baked at 150° C., such a film was found to be remarkably inferior in the specific resistance as a film to be used as a gate insulating film for an organic transistor. Further, the specific permittivity of the polyimide film was 3.6.

EXAMPLE 6

Figure 7:
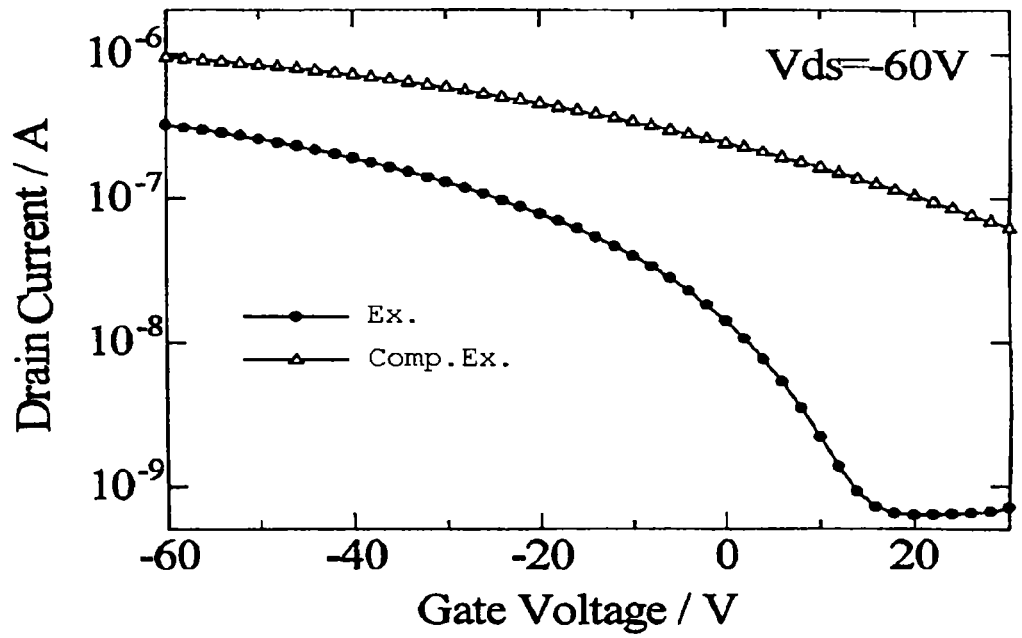
FIG. 7 is a graph showing a relationship between a drain current and a gate voltage of an organic transistor using a thin film obtained from the solution of each of PI-1 (EXAMPLE) and PI-4 (COMPARATIVE EXAMPLE), as a gate insulating film.

By using HP4156C (manufactured by Agilent K.K.), the electric characteristics of an organic transistor was measured in such a manner that in order to remove the influence of an ambient humidity and an active material, after completion of an element, it was rapidly moved into the vacuum state (vacuum degree: at most $5 \times 10^{-2}$ Pa) and then left to stand for about 30 minutes, and then the electrical characteristics were measured.
Evaluation of Electric Characteristics of Organic Transistor (Example)
In order to evaluate characteristics as a gate insulating film of polyimide, an organic transistor was prepared. On an ITO-coated glass substrate (2.5 cm×2.5 cm, thickness: 0.7 mm), the solution of PI-1 prepared in Preparation Example 1 was dropped by a syringe provided with a 0.2 μm-perforated filter and applied by a spin coating method. Then, it was heated on a hot plate of 80° C. for 5 minutes to evaporate the organic solvent and then baked on a hot plate of 150° C. for 60 minutes to obtain a polyimide film having a thickness of about 425 nm. Further, the capacitance C of the insulating film was calculated from the specific permittivity and the film thickness of polyimide, and was found to be $6.25 \times 10^{-9}$ (F/cm$^2$). Then, poly(3-hexylthiophene-2,5-diyl) (hereinafter, abbreviated as "P3HT") containing at least 98.5% of an HT bond manufactured by Sigma-Aldrich Co., was sufficiently purified and dissolved in 1 mass % of xylene to prepare a coating fluid of P3HT. Such a coating fluid was applied on polyimide to form a P3HT thin film. Such a film-forming method was carried out by using a spin coating method under nitrogen atmosphere in an oxygen concentration of at most 0.5 ppm. Then, in order to completely evaporate a solvent, heating treatment was carried out under a vacuum state at 100° C. for 90 minutes. Then, by using a vacuum deposition apparatus, about 60 nm of gold was laminated on a P3HT film to form a source electrode and a drain electrode having a channel length L of 90 μm and a channel width W of 2 mm. Further, the conditions during the vacuum deposition were such that a temperature was room temperature, the vacuum degree was at most $3 \times 10^{-3}$ Pa, the deposition rate of gold was at most 0.1 nm/sec. Such an organic transistor prepared was left to stand over night under a nitrogen atmosphere in an oxygen concentration of at most 0.5 ppm, and then exposed in an atmosphere once so as to be mounted in a measurement apparatus, followed by evaluation of the electric characteristics.
By using a vacuum chamber, the electric characteristics were measured while the vacuum degree was kept at $5 \times 10^{-2}$ Pa or lower. In order to measure modulation of a drain current to a gate voltage, at a source/drain voltage ($V_D$) of −60 V, the gate voltage ($V_G$) was changed stepwise every 2 V from +20 V to −60 V, and the value obtained after the voltage was maintained for three seconds until the current was sufficiently stabilized, was taken as a measurement value of the drain current. The characteristics ($V_G$-$I_D$ characteristics) of a drain current to a gate voltage, measured in such a manner, are shown in FIG. 7. By applying the gate voltage in the minus direction, a drastic increase of the drain current $I_D$ was observed, whereby P3HT was confirmed to be operated as a p-type semiconductor. Usually, it is possible to represent the drain current $I_D$ in a saturated state, as the following formula. Namely, it is possible to obtain the mobility μ of an organic semiconductor from the inclination of a graph when the square root of the absolute value of the drain current $I_D$ was plotted on the ordinate and the gate voltage $V_G$ was plotted on the abscissa.

$$I_D = WC\mu(V_G - V_T)^2/2L$$

In the above formula, W represents a channel width of a transistor, L a channel length of a transistor, C a capacitance of a gate insulating film, $V_T$ threshold of a transistor, and μ a mobility. The mobility μ of P3HT was calculated on the basis of the above formula, and was found to be $9.1 \times 10^{-4}$ cm$^2$/Vs. Further, the threshold voltage $V_T$ was 15 V, the current flown in an off-state of an organic transistor, i.e. the off-current was 0.65 nA, and the ratio (on/off ratio) of on-state to off-state was 580 (Table 4).

Thus, the gate insulating film of the present invention showed sufficiently excellent characteristics as an organic transistor.

TABLE 4

| Insulating film | Mobility | On/off | $V_T$ | Off-current (nA) | nF/cm$^2$ |
|---|---|---|---|---|---|
| Example | $9.1 \times 10^{-4}$ | 580 | 15 | 0.65 | 6.25 |
| Comparative Example | $8.7 \times 10^{-4}$ | 15 | Not measurable | 38.9 | 8.56 |

Evaluation of Electric Characteristics of Organic Transistor (Comparative Example)
By using a solution of P1-4 prepared in Comparative Preparation Example 1, an organic transistor was prepared in the same manner as in the above except that the film thickness was changed to 370 nm, and the electric characteristics was measured. The results are shown in Table 7. The capacitance C of such an insulating film was calculated from the specific permittivity and the film thickness of polyimide, and was found to be $8.56 \times 10^{-9}$ (F/cm$^2$). The mobility of P3HT was $8.7 \times 10^{-4}$ cm$^2$/Vs, the off-current was 38.9 nA, and the on/off ratio was 15. The threshold voltage was not measurable (Table 4) since it is impossible for an organic transistor to reach complete off-state.

Thus, the organic transistor using PI-4 has a very large amount of leak current and cannot reach normal off-state, and therefore it was found that such an organic transistor cannot be used as an organic transistor.

EXAMPLE 7

PREPARATION EXAMPLE 4

Preparation of Soluble Polyimide (PI-5)

In a nitrogen stream, into a 200 ml four-necked flask, 5.435 g (0.015 mol) of 2,2-bis(3-amino-4-methylphenyl) hexafluoropropane was put and dissolved in 36.75 g of NMP, and then 3.753 g (0.015 mol) of bicyclo[3.3.0]-octane-2,4,6,8-tetracarboxylic dianhydride was added. The mixture was stirred at 80° C. for 48 hours to carry out a polymerization reaction. The polyamic acid solution obtained was diluted with NMP to 8 mass %. To such a solution, 19.55 g of acetic anhydride and 9.09 g of pyridine were added as imidation catalysts, followed by reacting at 100° C. for 3 hours to obtain a polyimide solution. This solution was put into a large amount of a mixed solvent of water and methanol, and the obtained white precipitate was collected by filtration and dried to obtain a white polyimide powder containing repeating units represented by the following formula. This polyimide powder was confirmed to be 90% imidated by $^1$H-NMR. The number average molecular weight (Mn) and the weight average molecular weight (Mw) of such a polyimide powder were Mn=11,400 and Mw=18,000, respectively.

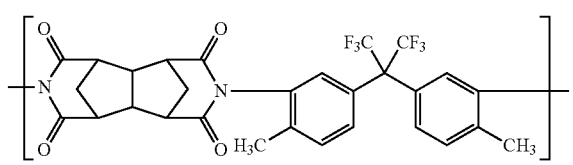

PREPARATION EXAMPLE 5

Preparation of Soluble Polyimide (PI-6)

In a nitrogen stream, into a 200 mL four-necked flask, 2.029 g (0.0056 mol) of 2,2-bis(3-amino-4-methylphenyl)hexafluoropropane was put and dissolved in 24.67 g of NMP, and then 3.36 g of (0.0112 mol) of 3,4-dicarboxy-1,2,3,4-tetrahydro-1-naphthalene succinic acid dianhydride was added, followed by stirring at 50° C. for 15 hours. And 5.045 g (0.0168 mol) of 3,4-dicarboxy-1,2,3,4-tetrahydro-1-naphthalene succinic acid dianhydride, 3.925 g (0.0196 mmol) of 4,4-diaminodiphenyl ether and 1.055 g (0.0028 mol) of 1-octadecyloxy-2,4-diaminobenzene were added thereto, followed by stirring at 50° C. for 24 hours to carry out a polymerization reaction. The polyamic acid solution obtained was diluted with NMP to 8 mass %. To this solution, 28.55 g of acetic anhydride and 13.28 g of pyridine were added as imidation catalysts, followed by a reaction at 50° C. for 3 hours to obtain a polyimide solution. This solution was put into a large amount of methanol, and the obtained white precipitate was collected by filtration and dried to obtain a white polyimide powder containing repeating units represented by the following formula. This polyimide powder was confirmed to be 95% imidated by $^1$H-NMR. The number average molecular weight (Mn) and the weight average molecular weight (Mw) of such a polyimide powder were Mn=13,500 and Mw=28,200, respectively.

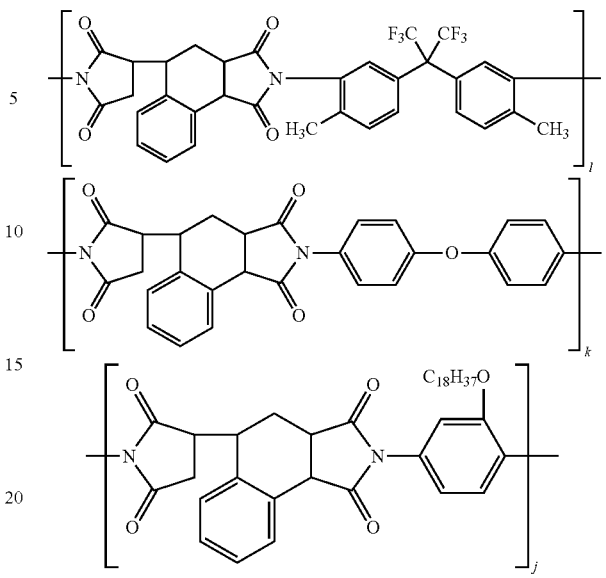

(Wherein the ratio of l, k and j was represented by the following formula. l/(l+k+j)=0.2, and k/(l+k+j)=0.7)

PREPARATION EXAMPLE 6

Preparation of Soluble Polyimide (PI-7)

In a nitrogen stream, into a 200 mL four-necked flask, 2.79 g (0.00689 mol) of 2,2-bis(3-amino-4-methylphenyl)hexafluoropropane and 9.85 g (0.0272 mol) of 2,2-bis(3-amino-4-methylphenyl)hexafluoropropane were put and dissolved in 76.48 g of NMP and then 6.59 g (0.0337 mol) of 1,2,3,4-cyclobutane tetracarboxylic dianhydride was added. The mixture was stirred at room temperature for 8 hours to carry out a polymerization reaction. The obtained polyamic acid solution was diluted with NMP to 5 mass %. To this solution, 12.8 g of acetic anhydride and 9.9 g of pyridine were added as imidation catalysts, followed by a reaction at 50° C. for 3 hours to obtain a polyimide solution. This solution was put into a large amount of a mixed solution of methanol and water, and the obtained white precipitate was collected by filtration and dried to obtain a white polyimide powder containing repeating units represented by the following formula. This polyimide powder was confirmed to be 95% imidated by $^1$H-NMR. The number average molecular weight (Mn) and the weight average molecular weight (Mw) of such a polyimide powder were Mn=24,000 and Mw=42,000, respectively.

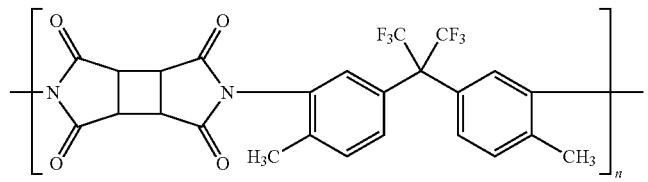

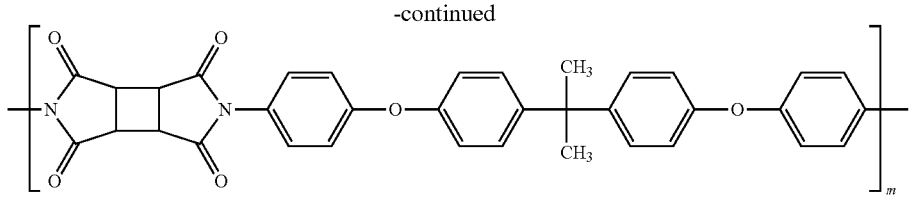

(Wherein the ratio of n and m is represented by the following formula. n/(n+m)=0.8)

COMPARATIVE PREPARATION EXAMPLE 2

Preparation of Soluble Polyimide (PI-8)

In a nitrogen stream, into a 200 mL four-necked flask, 2.79 g (0.00689 mol) of 2,2-bis(3-amino-4-methylphenyl)hexafluoropropane and 9.85 g (0.0272 mol) of 2,2-bis(3-amino-4-methylphenyl)hexafluoropropane were put and dissolved in 76.48 g of NMP, and then 6.67 g (0.034 mol) of 1,2,3,4-cyclobutane tetracarboxylic dianhydride was added. The mixture was stirred at room temperature for 8 hours to carry out a polymerization reaction. The polyamic acid solution obtained was diluted with NMP to 5 mass %. To this solution, 12.8 g of acetic anhydride and 9.9 g of pyridine were added as imidation catalysts, followed by a reaction at 50° C. for 3 hours to obtain a polyimide solution. This solution was put into a large amount of a mixed solution of methanol and water, and the obtained white precipitate was collected by filtration and dried to obtain a white polyimide powder represented by the following formula. This polyimide powder was confirmed to be 95% imidated by $^1$H-NMR. The number average molecular weight (Mn) and the weight average molecular weight (Mw) of the obtained polyimide powder were Mn=29,000 and Mw=60,000, respectively.

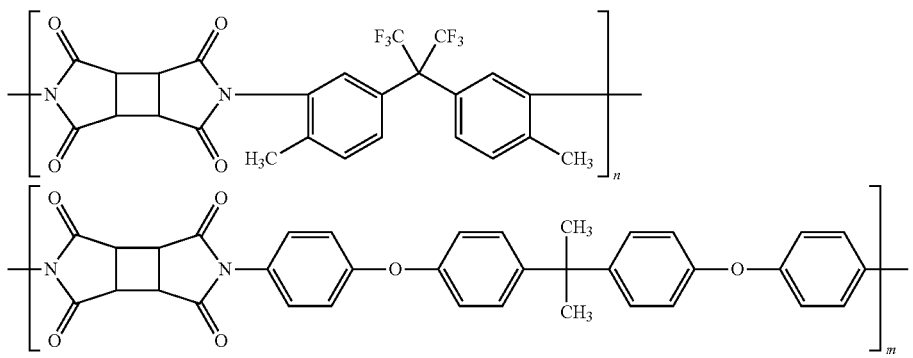

(Here the ratio of n and m is represented by the following formula. n/(n+m)=0.8)

EXAMPLE 8

Solvent Solubility of PI-5 (Example)

In order to investigate the solvent solubility of PI-5, by using propylene glycol monomethyl ether (PGME), propylene glycol monomethyl ether acetate (PGMEA), cyclohexanone and γ-butyrolactone, experiments were carried out under the following conditions.

Into a round flask, any one of low-boiling point solvent was put, and 10 mass % of a powdery PI-6 was charged thereinto, followed by stirring for 3 hours while heating the solvent in an oil bath so that the solvent temperature would be 50° C.

PI-5 had a good solubility in any of the solvents.

Solvent Solubility of PI-6 (Example)

In order to investigate a solvent solubility of PI-6, by using cyclohexanone and γ-butyrolactone, experiments were carried out under the following conditions.

Into a round flask, any one of low-boiling point solvents was put, and 10 mass % of a powdery PI-6 was charged thereinto, followed by stirring for 3 hours while heating the solvent in an oil bath so that the solvent temperature would be 50° C.

PI-6 showed good solubility in any of the solvents.

Solvent Solubility of PI-7 (Example)

In order to investigate the solvent solubility of PI-7, cyclohexanone was put into a round flask, and 10 mass % of a powdery PI-7 was charged thereinto, followed by stirring for 3 hours while heating the solvent in an oil bath so that the solvent temperature would be 50° C.

PI-7 showed a good solubility in cyclohexanone.

Solvent Solubility of PI-8 (Comparative Example)

In order to investigate the solvent solubility of PI-8, by using propylene glycol monomethyl ether (PGME), propylene glycol monomethyl ether acetate (PGMEA) and cyclohexanone, experiments were carried out under the following conditions.

Into a round flask, any one of low-boiling point solvents was put, and 10 mass % of a powdery PI-8 was charged thereinto, followed by stirring for 3 hours while heating the solvent in an oil bath so that the solvent temperature would be 50° C.

PI-8 was insoluble in all of the solvents.

The evaluation results of the above solubility were summarized in Table 5 (provided that blanks represents "not evaluated").

TABLE 5

| | | PGME | PGMEA | CH | GBL | Mn | Mw | Imidated ratio |
|---|---|---|---|---|---|---|---|---|
| Ex. | PI-5 | ○ | ○ | ○ | ○ | 11,400 | 18,000 | 90% |
| Ex. | PI-6 | | | ○ | ○ | 13,500 | 28,200 | 95% |
| Ex. | PI-7 | | | ○ | | 24,000 | 42,000 | 95% |
| Comp. Ex. | PI-8 | X | X | X | | 29,000 | 60,000 | 95% |

EXAMPLE 9

Solvent Resistance of PI-5 (Example)

In order to investigate the solvent resistance of PI-5 to xylene, a polyimide film having a thickness of 307 nm was formed in the same manner as in Example 4, and immersed in a xylene solvent heated to 50° C. for 5 minutes. Then, a solvent was dried on a hot plate of 180° C. to measure the film remaining rate. The film remaining rate of a polyimide film made of PI-5 was 100%, and therefore good solvent resistance was shown.

INDUSTRIAL APPLICABILITY

By the gate insulating film of the present invention, it is possible to lower a temperature in a production process of an organic transistor and to provide an inexpensive and high-performance organic transistor.

The entire disclosure of Japanese Patent Application No. 2006-143716 filed on May 24, 2006 including specification, claims, drawings and summary is incorporated herein by reference in its entirety.

The invention claimed is:

1. A process for producing an organic transistor, comprising:
    applying a solution containing at least one solvent selected from the group consisting of a glycol, a lactate and a Ketone, and a polyimide on a substrate and a gate electrode and baking at a temperature of at most 180° C.;
    wherein the organic solvent soluble polyimide is obtained by cyclodehydration of a polyamic acid having repeating units represented by the following formula (1),

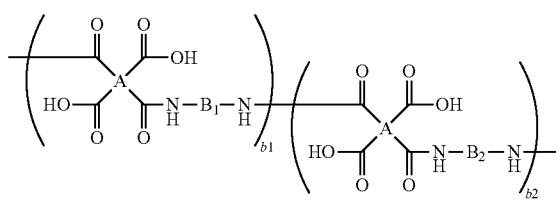

(1)

wherein A is a tetravalent organic group, $B_1$ is at least one bivalent organic group selected from the following formulae (2), (3), (4) and (5),

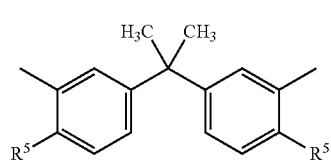

(2)

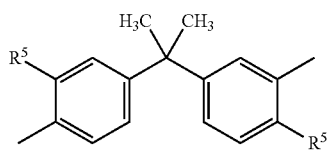

(3)

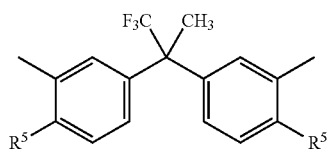

(4)

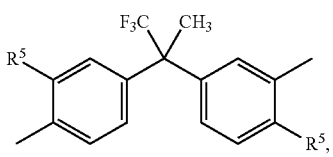

(5)

and $B_2$ is a bivalent organic group other than the following formulae (2) to (9):

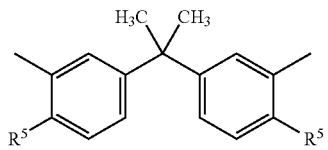

(2)

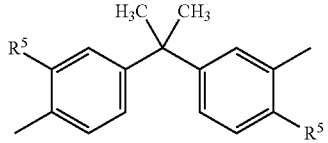

(3)

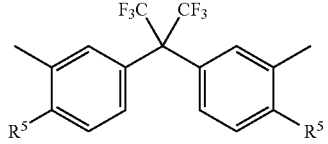

(4)

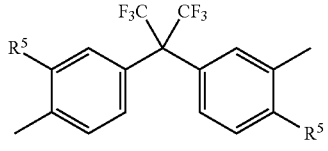

(5)

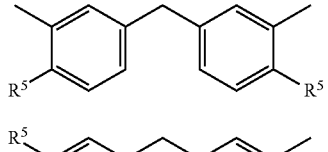

(6)

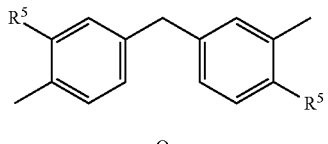

(7)

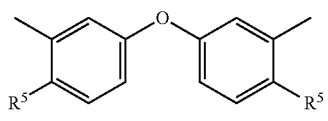

(8)

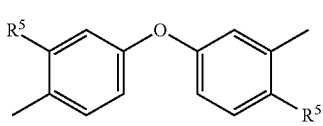

wherein each $R^5$ independently is a hydrogen, a methyl group or a trifluoromethyl group, each of b1 and b2 represents a compositional ratio, and b1 and b2 have a relationship of $0.5 \leq (b1/(b1+b2)) \leq 1$ in ratio (mol).

2. The process according to claim 1, wherein in the formula (1), A is a tetravalent organic group having an alicyclic structure.

3. The process according to claim 2, wherein the tetravalent organic group having an alicyclic structure is at least one member selected from the group consisting of the following formulae (10) to (14):

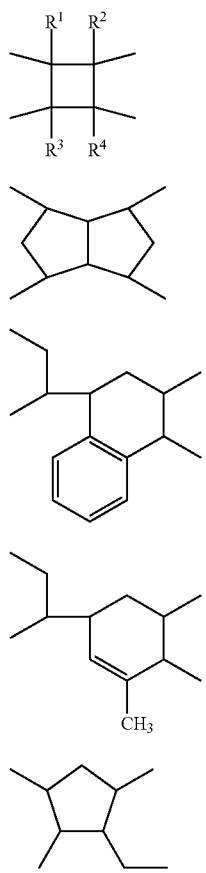

in the formula (10), each of $R^1$, $R^2$, $R^3$ and $R^4$ which are independent of one another, is hydrogen, fluorine or a $C_{1-4}$ organic group.

4. The process according to claim 1, wherein in the formula (1), R6 in B1 represents a methyl group or a trifluoromethyl group.

5. The process according to claim 1, wherein the baking process is carried out at most 150° C.

6. The process according to claim 1, wherein in the organic-solvent soluble polyimide has an imidated ratio of at least 50%.

7. The process according to claim 1, wherein the solvent in the solution containing the organic-solvent soluble polyimide has a boiling point of at most 200° C.

8. The process according to claim 1, wherein in the organic-solvent soluble polyimide comprises a polyimide having a weight average molecular weight from 15,100 to 16,900.

9. The process according to claim 1, wherein the substrate is a plastic substrate selected from the group consisting of a polycarbonate substrate and a polyethylene terephthalate substrate.

10. The process according to claim 1, wherein the solution further comprises a polyamic acid.

11. The process according to claim 1, wherein the solution is applied to a substrate comprising a gate electrode, a source electrode, a drain electrode and a gate insulating film, and the baking forms an organic semiconductor layer on the gate insulating film, the source electrode and the drain electrode.

12. The process according to claim 11, wherein the gate insulating film has a specific resistance of at least $5.7 \times 10^{15} \Omega \cdot cm$.

13. The process according to claim 11, wherein the substrate is made of at least one plastic selected from the group consisting of polycarbonate plastic and polyethylene terephthalate.

14. The process according to claim 1, wherein the substrate is a flexible plastic.

15. The process according to claim 1, wherein the solvent does not contain an amide.

16. The process according to claim 1, wherein the solution is in a ketone solvent.

17. The process according to claim 16, wherein the ketone solvent is cyclohexanone.

18. The process according to claim 1, wherein $B_1$ has the following formula (4):

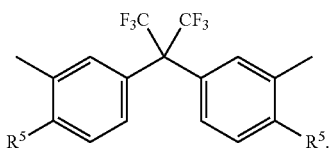

19. The process according to claim 1, wherein the polyamic acid does not contain any units derived from pyromellitic anhydride.

20. The process according to claim 1, wherein the group A is a cyclobutane group.

21. The process according to claim 1, wherein $R^5$ in $B_1$ is a methyl group and the substrate is a polymer.

* * * * *